(12) United States Patent
Yamaguchi et al.

(10) Patent No.: US 12,358,015 B2
(45) Date of Patent: Jul. 15, 2025

(54) SUBSTRATE PROCESSING APPARATUS AND METHOD OF MACHINING TUBULAR GUARD

(71) Applicant: SCREEN Holdings Co., Ltd., Kyoto (JP)

(72) Inventors: Takahiro Yamaguchi, Kyoto (JP); Jun Sawashima, Kyoto (JP); Toru Endo, Kyoto (JP); Rikuta Aoki, Kyoto (JP)

(73) Assignee: SCREEM Holdings Co., Ltd., Kyoto (JP)

( * ) Notice: Subject to any disclaimer, the term of this patent is extended or adjusted under 35 U.S.C. 154(b) by 0 days.

(21) Appl. No.: 18/484,154

(22) Filed: Oct. 10, 2023

(65) Prior Publication Data

US 2024/0042479 A1 Feb. 8, 2024

Related U.S. Application Data

(63) Continuation of application No. 17/584,506, filed on Jan. 26, 2022, now Pat. No. 11,819,872.

(30) Foreign Application Priority Data

Feb. 15, 2021 (JP) .................. 2021-021618

(51) Int. Cl.
 *B05C 11/08* (2006.01)
 *B05C 11/10* (2006.01)
 *B05D 1/00* (2006.01)
(52) U.S. Cl.
 CPC .......... *B05C 11/08* (2013.01); *B05C 11/1002* (2013.01); *B05D 1/005* (2013.01)
(58) Field of Classification Search
 None
 See application file for complete search history.

(56) References Cited

U.S. PATENT DOCUMENTS 5,089,305 A 2/1992 Ushijima
5,099,782 A 3/1992 Nakazawa
(Continued)

FOREIGN PATENT DOCUMENTS

JP H10-057876 A 3/1998
JP 2006-159145 A 6/2006
(Continued)

*Primary Examiner* — Jethro M. Pence
(74) *Attorney, Agent, or Firm* — OSTROLENK FABER LLP

(57) ABSTRACT

A substrate processing apparatus includes a rotational holding member that rotates a substrate around a predetermined rotational axis while holding the substrate, a liquid supply member that supplies a liquid to the substrate held by the rotational holding member, and a resin-made tubular guard that surrounds the substrate held by the rotational holding member. The tubular guard has an inner peripheral surface and an uneven portion disposed at the inner peripheral surface. The uneven portion has a plurality of recessed portions and a plurality of protruding portions placed between the recessed portions adjacent to each other. The recessed portion has a width smaller than a diameter of a liquid droplet scattering from the substrate held by the rotational holding member and a depth in which the liquid droplet does not come into contact with a bottom portion of the recessed portion in a state in which the liquid droplet is in contact with the protruding portions. The protruding portion has a width that is smaller than the diameter of the liquid droplet and that is smaller than the width of the recessed portion.

9 Claims, 17 Drawing Sheets

(56) References Cited

U.S. PATENT DOCUMENTS

| | | | |
|---|---|---|---|
| 5,219,615 A | 6/1993 | Nakazawa | |
| 5,260,174 A | 11/1993 | Nakazawa | |
| 5,312,487 A | 5/1994 | Akimoto | |
| 5,374,312 A | 12/1994 | Hasebe | |
| 5,658,387 A * | 8/1997 | Reardon | H01L 21/6715 118/667 |
| 5,772,764 A | 6/1998 | Akimoto | |
| 5,843,527 A | 12/1998 | Sanada | |
| 5,906,860 A * | 5/1999 | Motoda | B05C 11/08 118/52 |
| 5,939,130 A | 8/1999 | Shiraishi | |
| 5,960,225 A | 9/1999 | Fujimoto | |
| 5,985,357 A | 11/1999 | Sanada | |
| 5,989,632 A | 11/1999 | Sanada | |
| 6,159,288 A * | 12/2000 | Satou | B05C 11/08 118/52 |
| 6,159,541 A | 12/2000 | Sakai | |
| 6,165,552 A | 12/2000 | Anai | |
| 6,168,665 B1 * | 1/2001 | Sakai | H01L 21/67017 118/506 |
| 6,207,231 B1 | 3/2001 | Tateyama | |
| 6,270,576 B1 | 8/2001 | Araki | |
| 6,391,110 B1 * | 5/2002 | Satou | B05C 11/08 118/52 |
| 6,398,879 B1 * | 6/2002 | Satou | B05C 11/08 134/36 |
| 6,410,194 B1 | 6/2002 | Yoshihara | |
| 6,444,029 B1 | 9/2002 | Kimura | |
| 6,444,409 B2 | 9/2002 | Araki | |
| 6,447,608 B1 | 9/2002 | Sakai | |
| 6,458,208 B1 | 10/2002 | Anai | |
| 6,569,241 B2 * | 5/2003 | Gordon | G03F 7/162 118/503 |
| 6,620,244 B2 | 9/2003 | Yoshihara | |
| 6,770,149 B2 * | 8/2004 | Satou | B05C 11/08 134/36 |
| 6,827,782 B2 | 12/2004 | Goto | |
| 6,982,002 B2 | 1/2006 | Tanaka | |
| 7,267,723 B2 | 9/2007 | Goto | |
| 7,575,634 B2 | 8/2009 | Shite | |
| 7,790,227 B2 | 9/2010 | Shite | |
| 7,802,536 B2 | 9/2010 | Yoshihara | |
| 7,976,896 B2 | 7/2011 | Fukuda | |
| 8,287,954 B2 | 10/2012 | Yoshihara | |
| 8,304,018 B2 | 11/2012 | Takayanagi | |
| 8,316,795 B2 | 11/2012 | Kinoshita | |
| 8,568,043 B2 | 10/2013 | Matsuoka | |
| 8,667,924 B2 | 3/2014 | Sahoda | |
| 8,807,072 B2 | 8/2014 | Shimai | |
| 8,846,145 B2 | 9/2014 | Kinoshita | |
| 8,865,396 B2 | 10/2014 | Takeguchi | |
| 9,070,731 B2 | 6/2015 | Tachibana | |
| 9,171,745 B2 | 10/2015 | Suzuki | |
| 9,195,138 B2 | 11/2015 | Sasagawa | |
| 9,217,922 B2 | 12/2015 | Kubota | |
| 9,256,131 B2 | 2/2016 | Takeguchi | |
| 9,355,871 B2 * | 5/2016 | Higashijima | B05B 14/00 |
| 9,613,836 B2 | 4/2017 | Ichino | |
| 9,620,394 B2 | 4/2017 | Kishita | |
| 9,623,435 B2 | 4/2017 | Wakamoto | |
| 9,679,787 B2 | 6/2017 | Furuya | |
| 9,687,873 B2 | 6/2017 | Tachibana | |
| 9,793,118 B2 | 10/2017 | Ahn | |
| 9,818,654 B2 | 11/2017 | Hayashi | |
| 9,897,919 B2 | 2/2018 | Nonaka | |
| 9,899,244 B2 | 2/2018 | Kishita | |
| 10,048,664 B2 | 8/2018 | Hasimoto | |
| 10,068,763 B2 | 9/2018 | Yoshihara | |
| 10,128,136 B2 | 11/2018 | Fukuda | |
| 10,168,618 B2 | 1/2019 | Sasagawa | |
| 10,170,349 B2 | 1/2019 | Maeda | |
| 10,394,125 B2 * | 8/2019 | Kawakami | B05D 1/005 |
| 10,629,459 B2 | 4/2020 | Miyagi | |
| 10,643,872 B2 | 5/2020 | Abe | |
| 10,672,606 B2 | 6/2020 | Yoshihara | |
| 10,732,508 B2 * | 8/2020 | Kawakami | G03F 7/32 |
| 10,761,422 B2 | 9/2020 | Miyagi | |
| 10,838,311 B2 | 11/2020 | Nakano | |
| 10,879,091 B2 | 12/2020 | Maeda | |
| 11,018,034 B2 | 5/2021 | Endo | |
| 11,114,302 B2 | 9/2021 | Tsuda | |
| 11,148,150 B2 | 10/2021 | Choi | |
| 11,244,838 B2 * | 2/2022 | Ueki | B05D 1/005 |
| 11,340,533 B2 | 5/2022 | Park | |
| 11,373,889 B2 | 6/2022 | Maeda | |
| 11,561,473 B2 | 1/2023 | Yamauchi | |
| 11,640,911 B2 * | 5/2023 | Ueki | H01L 21/6708 438/8 |
| 11,819,872 B2 * | 11/2023 | Yamaguchi | G03F 7/168 |
| 12,036,573 B2 * | 7/2024 | Inaba | B05D 1/005 |
| 2004/0261701 A1 * | 12/2004 | Kobayashi | G03F 7/162 427/427.2 |
| 2008/0280054 A1 | 11/2008 | Ogata | |
| 2012/0255581 A1 | 10/2012 | Kometani | |
| 2013/0167947 A1 | 7/2013 | Nakano et al. | |
| 2014/0017407 A1 | 1/2014 | Shimai | |
| 2015/0096682 A1 | 4/2015 | Nakashima | |
| 2015/0099355 A1 | 4/2015 | Inatomi | |
| 2015/0165458 A1 | 6/2015 | Funakoshi | |
| 2017/0084470 A1 * | 3/2017 | Suzuki | F26B 3/04 |
| 2017/0361364 A1 | 12/2017 | Ogata et al. | |
| 2018/0046083 A1 | 2/2018 | Kashiyama | |
| 2018/0047592 A1 | 2/2018 | Fukuda | |
| 2018/0149911 A1 * | 5/2018 | Yamaguchi | G09G 3/3688 |
| 2019/0317408 A1 | 10/2019 | Goo | |
| 2020/0035518 A1 | 1/2020 | Miyagi | |
| 2020/0064741 A1 | 2/2020 | Nakashima | |
| 2021/0013058 A1 | 1/2021 | Park | |
| 2021/0181638 A1 | 6/2021 | Yamauchi | |
| 2021/0278768 A1 | 9/2021 | Sakata | |
| 2022/0163891 A1 | 5/2022 | Eum | |
| 2022/0163892 A1 | 5/2022 | Eum | |
| 2022/0163900 A1 | 5/2022 | Eum | |
| 2022/0197145 A1 | 6/2022 | Kim | |
| 2022/0205090 A1 | 6/2022 | Kim | |
| 2022/0205100 A1 | 6/2022 | Choi | |
| 2022/0206392 A1 | 6/2022 | Noh | |
| 2022/0277971 A1 | 9/2022 | Maeda | |
| 2022/0388020 A1 | 12/2022 | Yasutake | |
| 2023/0219116 A1 * | 7/2023 | Hashimoto | H01L 21/67051 427/425 |
| 2024/0009697 A1 * | 1/2024 | Kim | B05C 11/08 |
| 2024/0042479 A1 * | 2/2024 | Yamaguchi | B05C 11/08 |
| 2024/0066548 A1 * | 2/2024 | Nemoto | H01L 21/68785 |

FOREIGN PATENT DOCUMENTS

| | | |
|---|---|---|
| JP | 2013-138089 A | 7/2013 |
| JP | 2016-012629 A | 1/2016 |
| JP | 2017-228613 A | 12/2017 |
| JP | 2018-166135 A | 10/2018 |
| JP | 2020-155590 A | 9/2020 |
| KR | 102017-0056963 A | 5/2017 |

* cited by examiner

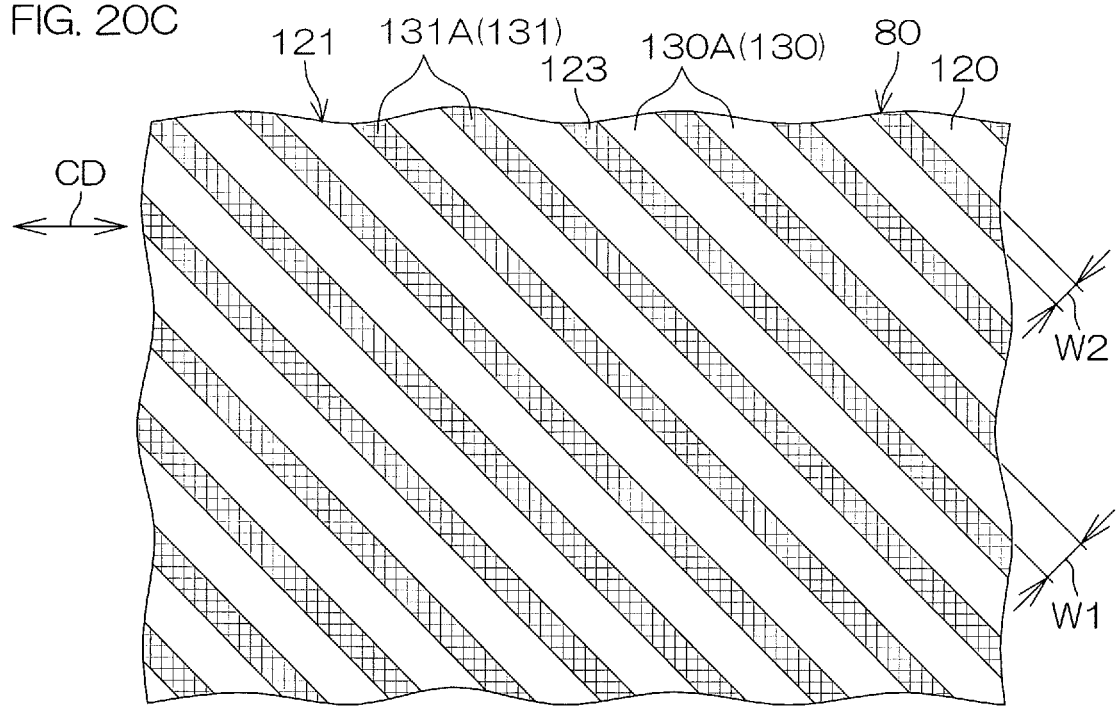
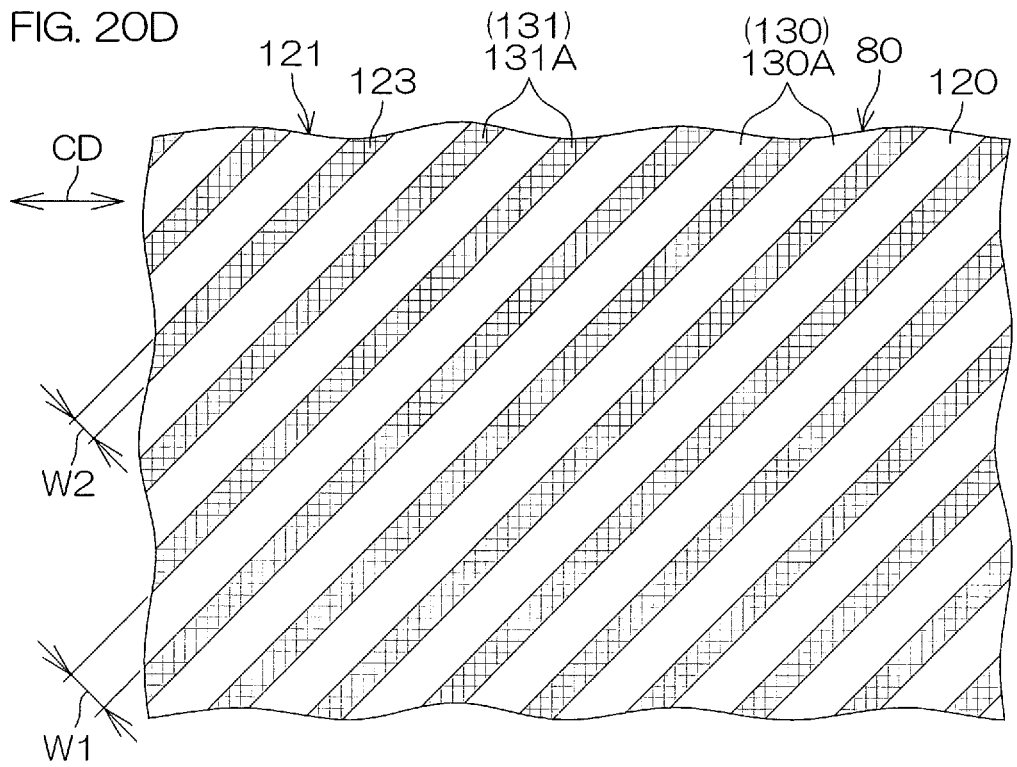

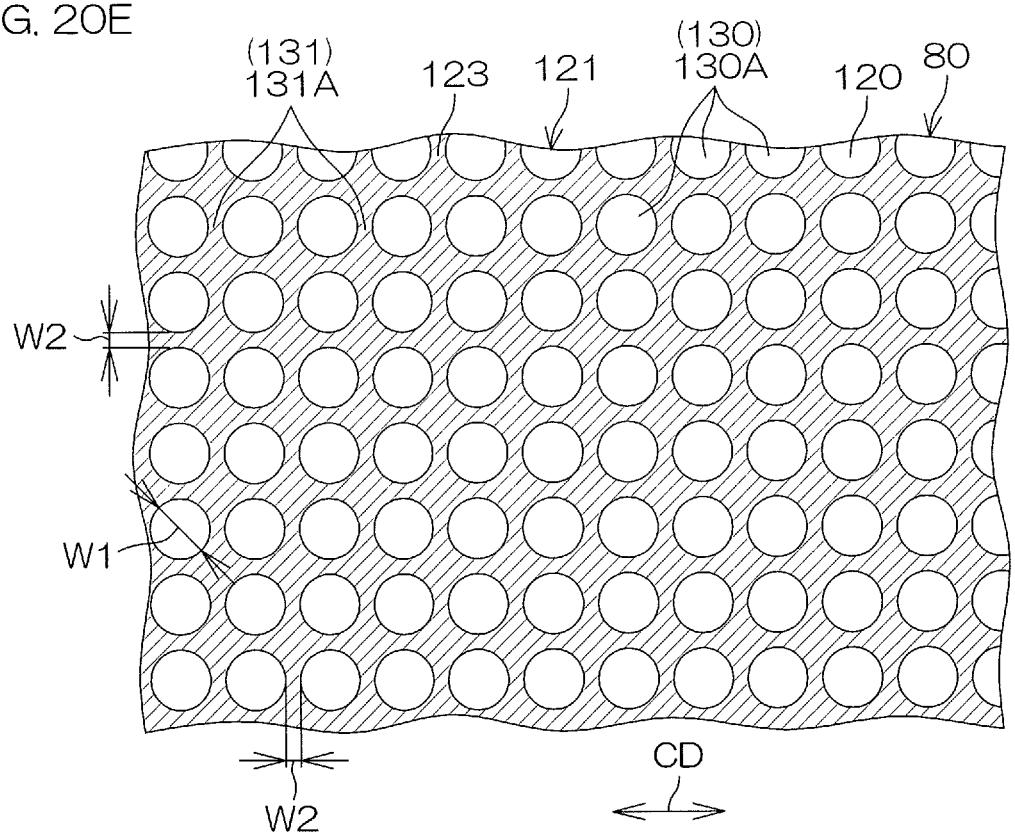

SUBSTRATE PROCESSING APPARATUS AND METHOD OF MACHINING TUBULAR GUARD

CROSS-REFERENCE TO RELATED APPLICATIONS

This Continuation application claims priority to U.S. patent application Ser.No. 17/584,506, filed Jan. 26, 2022 and Japanese Patent Application No. 2021-21618 filed in the Japan Patent Office on Feb. 15, 2021, the entire disclosure of which is incorporated herein by reference.

BACKGROUND OF THE INVENTION

1. Field of the Invention

The present invention relates to a substrate processing apparatus that processes a substrate, and relates to a method of machining a tubular guard used in a substrate processing apparatus that processes a substrate. Examples of substrates to be processed include semiconductor wafers, substrates for flat panel displays (FPD) such as liquid crystal displays and organic electroluminescence (EL) displays, substrates for optical disks, substrates for magnetic disks, substrates for magneto-optical disks, substrates for photomasks, ceramic substrates, substrates for solar cells, etc.

2. Description of the Related Art

A substrate processing apparatus that includes a tubular cup having a plurality of grooves extending in a longitudinal direction is disclosed by Japanese Patent Application Publication No. 2020-155590 and Japanese Patent Application Publication No. 2018-166135.

SUMMARY OF THE INVENTION

Each of the cups of Japanese Patent Application Publications No. 2020-155590 and No. 2018-166135 receives a droplet liquid dispersed from a substrate, and allows the liquid to slip down while dribbling on side surfaces and bottom surfaces of the grooves. This makes it possible to prevent the splash-back of the liquid droplets from the cup. A new configuration is expected that is capable of preventing liquid droplets from being splashed back from an inner peripheral surface of the cup.

Therefore, an object of the present invention is to provide a substrate processing apparatus capable of preventing liquid droplets from scattering from a tubular guard toward a substrate, and is to provide a method of machining the tubular guard.

One preferred embodiment of the present invention provides a substrate processing apparatus that includes a rotational holding member that rotates a substrate around a predetermined rotational axis while holding the substrate, a liquid supply member that supplies a liquid to the substrate held by the rotational holding member, and a resin-made tubular guard that surrounds the substrate held by the rotational holding member.

The tubular guard of the substrate processing apparatus has an inner peripheral surface and an uneven portion disposed at the inner peripheral surface, and the uneven portion has a plurality of recessed portions and a plurality of protruding portions placed between the recessed portions adjacent to each other. The recessed portion has a width smaller than a diameter of a liquid droplet scattering from the substrate held by the rotational holding member and a depth in which the liquid droplet does not come into contact with a bottom portion of the recessed portion in a state in which the liquid droplet is in contact with the protruding portions, and the protruding portion has a width that is smaller than the diameter of the liquid droplet and that is smaller than the width of the recessed portion.

With this substrate processing apparatus, it is possible to supply a liquid from the liquid supply member to the substrate held by the rotational holding member. When a liquid is supplied to the substrate being in a rotational state, liquid droplets that scatter from the substrate being rotated, and it is possible to receive the liquid droplets, which have scattered from the substrate, by the inner peripheral surface of the resin-made tubular guard surrounding the substrate.

The uneven portion disposed at the inner peripheral surface of the tubular guard has the recessed portions and the protruding portions placed between the recessed portions adjacent to each other. The recessed portion has a width smaller than the diameter of a liquid droplet, and the protruding portion has a width that is smaller than the diameter of the liquid droplet and that is smaller than the width of the recessed portion. Therefore, the liquid droplets received by the uneven portion of the inner peripheral surface do not completely enter the inside of the recessed portion, and come into contact with the protruding portions. Additionally, the depth of the recessed portion is a depth in which a liquid droplet does not come into contact with the bottom portion of the recessed portion in a state in which the liquid droplet is in contact with the protruding portions. If the uneven portion and the liquid droplet have this dimensional relationship, it is possible to make an area in which the liquid droplet comes into contact with the inner peripheral surface of the tubular guard smaller than a flat surface having no uneven portion. Therefore, it is possible to make the contact angle of the liquid droplet with respect to the uneven portion larger than the contact angle of the liquid droplet with respect to the flat surface at which the uneven portion is not formed. In other words, it is possible to improve the hydrophobicity of the inner peripheral surface.

Therefore, it is possible to prevent the liquid droplet, which has scattered from the substrate and which has been received by the inner peripheral surface of the tubular guard, from staying on the inner peripheral surface. Therefore, it is possible to reduce the amount of liquid droplets remaining on the inner peripheral surface of the tubular guard. As a result, it is possible to excellently prevent the scattering of liquid droplets from the inner peripheral surface toward the substrate, which is caused by a collision between liquid droplets newly scattering from the substrate and liquid droplets remaining on the inner peripheral surface. Therefore, it is possible to achieve prevention of the scattering of liquid droplets to the substrate from the tubular guard.

The diameter of a liquid droplet scattering from the substrate that is rotated at a rotation speed of 600 rpm or more and 1200 rpm or less is chiefly 1.5 mm or less. If the depth of the recessed portion is 10 μm or more and if the width of the recessed portion and the width of the protruding portion are smaller than 1.5 mm, it is possible to effectively prevent the contact of a liquid droplet having a diameter of 1.5 mm or less with the bottom portion of the recessed portion, and it is possible to achieve hydrophobization with respect to a liquid droplet having a diameter of 1.5 mm or less.

Particularly, if the width of the recessed portion is 100 μm or more and is smaller than 1.0 mm, and if the depth of the recessed portion is 200 μm or less, and if the width of the protruding portion is 40 μm or less, it is possible to effectively prevent the contact of a liquid droplet having a diameter of 1.5 mm or less with the bottom portion of the recessed portion, and it is possible to excellently hydrophobize the inner peripheral surface. The average surface roughness of the uneven portion having this dimensional relationship is 3.0 or more and 6.0 or less.

In one preferred embodiment of the present invention, the recessed portions include a plurality of circular groove portions along a circumferential direction of the inner peripheral surface. The circular groove portions are disposed at the inner peripheral surface with intervals between the circular groove portions in an axial direction along a central axis of the inner peripheral surface. Therefore, it is possible to improve the hydrophobicity of the inner peripheral surface in the whole area in the circumferential direction of the inner peripheral surface. Therefore, it is possible to thoroughly prevent liquid droplets, which have scattered from the substrate and which have been received by the inner peripheral surface of the tubular guard, from remaining on the inner peripheral surface in the whole area of the inner peripheral surface.

In one preferred embodiment of the present invention, the recessed portions include a plurality of intersection groove portions extending in a direction intersecting the circular groove portion. A lattice shape is formed by the intersection groove portions and the circular groove portions. Therefore, hydrophobicity can be evenly made in the whole area of the uneven portion higher than in a configuration in which only the circular groove portion is provided as the recessed portion.

In one preferred embodiment of the present invention, the inner peripheral surface of the tubular guard has a tubular surface extending in a vertical direction and an inclined surface that is connected to an upper end of the tubular surface and that extends obliquely with respect to the tubular surface. The recessed portions include a plurality of first recessed portions formed at the inclined surface.

Liquid droplets scattering obliquely upwardly from the substrate are chiefly received by the inclined surface connected to the upper end of the tubular surface, and liquid droplets scattering obliquely downwardly from the substrate are chiefly received by the tubular surface. Liquid droplets scattering from the inner peripheral surface of the tubular guard are liable to scatter obliquely downwardly, and therefore the re-adhesion of liquid droplets scattering from the inclined surface to the substrate tends to be more problematic than liquid droplets scattering from the tubular surface.

Therefore, if a configuration in which the recessed portions include the first recessed portions formed at the inclined surface is employed, it is possible to improve the hydrophobicity of the inclined surface, and therefore it is possible to excellently prevent the adhesion of liquid droplets scattering from the inner peripheral surface to the substrate.

In one preferred embodiment of the present invention, the recessed portions include a plurality of second recessed portions formed at the tubular surface. Liquid droplets received by the inclined surface move downwardly along the inclined surface, and are guided to the tubular surface. If a configuration in which the recessed portions include the second recessed portions formed at the tubular surface is employed, it is possible to improve the hydrophobicity of the tubular surface, and therefore it is possible to prevent a liquid from remaining on the tubular surface. Therefore, it is possible to prevent a collision between liquid droplets scattering from the substrate toward the tubular surface and liquid droplets remaining on the tubular surface. As a result, it is possible to excellently prevent the scattering of liquid droplets from the tubular surface toward the substrate, which is caused by a collision between liquid droplets newly scattering from the substrate and liquid droplets remaining on the tubular surface.

In one preferred embodiment of the present invention, the protruding portions include a plurality of first protruding portions placed between the first recessed portions adjacent to each other and a second protruding portion placed between the second recessed portions adjacent to each other. A width of the first protruding portion is smaller than a width of the second protruding portion.

With this substrate processing apparatus, the width of the first protruding portion is smaller than the width of the second protruding portion, and therefore the hydrophobicity of the inclined surface is higher than the hydrophobicity of the tubular surface. It is possible to prevent liquid droplets from remaining on the inclined surface by making the hydrophobicity of the inclined surface higher than the hydrophobicity of the tubular surface. Liquid droplets scattering from the inclined surface of the tubular guard more easily adhere to the substrate than liquid droplets scattering from the tubular surface. Therefore, it is possible to prevent liquid droplets from scattering from the inclined surface and adhering to the substrate by raising the hydrophobicity of the inclined surface.

In one preferred embodiment of the present invention, the tubular guard is made of hydrophobic resin. Therefore, it is possible to further improve the hydrophobicity of the inner peripheral surface of the tubular guard.

Another preferred embodiment of the present invention provides a substrate processing apparatus that includes a rotational holding member that holds a substrate so that the substrate rotates around a predetermined rotational axis, a liquid supply member that supplies a liquid to the substrate held by the rotational holding member, and a resin-made tubular guard surrounding the rotational holding member. The tubular guard of this substrate processing apparatus has an inner peripheral surface and an uneven portion disposed at inner peripheral surface, and the uneven portion has a plurality of recessed portions and a plurality of protruding portions placed between the recessed portions adjacent to each other. The recessed portion has a depth of 10 μm or more and a width smaller than 1.5 mm, and the protruding portion has a width that is smaller than the width of the recessed portion and that is smaller than 1.5 mm.

With this substrate processing apparatus, as described above, it is possible to effectively prevent the contact of a liquid droplet having a diameter of 1.5 mm or less with the bottom portion of the recessed portion, and it is possible to achieve hydrophobization with respect to a liquid droplet having a diameter of 1.5 mm or less.

Therefore, it is possible to prevent the liquid droplet, which has scattered from the substrate and which has been received by the inner peripheral surface of the tubular guard, from staying on the inner peripheral surface. It is possible to reduce the amount of liquid droplets remaining on the inner peripheral surface of the tubular guard, and therefore it is possible to excellently prevent the scattering of liquid droplets from the inner peripheral surface toward the substrate, which is caused by a collision between liquid droplets newly scattering from the substrate and liquid droplets remaining on the inner peripheral surface.

In another preferred embodiment of the present invention, the width of the recessed portion may be 100 μm or more and be smaller than 1.0 mm, and the depth of the recessed portion may be 200 μm or less. The width of the protruding portion may be 40 μm or less.

In another preferred embodiment of the present invention, the average surface roughness of the inner peripheral surface may be 3.0 or more and 6.0 or less.

Still another preferred embodiment of the present invention provides a method of machining a resin-made tubular guard to surround a rotational holding member that rotates a substrate around a predetermined rotational axis while holding the substrate in a substrate processing apparatus that processes the substrate with a liquid. The machining method includes a guard preparation step of preparing a tubular guard having an inner peripheral surface and a hydrophobizing step of hydrophobizing the inner peripheral surface of the tubular guard by forming an uneven portion at the inner peripheral surface.

According to this machining method, it is possible to manufacture a tubular guard having an inner peripheral surface at which an uneven portion that hydrophobizes the inner peripheral surface is formed. Therefore, it is possible to make the hydrophobicity of the inner peripheral surface better than a surface at which the uneven portion is not formed. Additionally, it is possible to supplementarily form an uneven portion at the tubular guard at which an uneven portion has already been formed.

Therefore, it is possible to prevent liquid droplets, which have scattered from the substrate and which have been received by the inner peripheral surface of the tubular guard, from staying on the inner peripheral surface. It is possible to reduce the amount of liquid droplets remaining on the inner peripheral surface of the tubular guard, and therefore it is possible to excellently prevent the scattering of liquid droplets from the inner peripheral surface toward the substrate, which is caused by a collision between liquid droplets newly scattering from the substrate and liquid droplets remaining on the inner peripheral surface. Therefore, it is possible to achieve prevention of the scattering of liquid droplets to the substrate from the tubular guard.

In still another preferred embodiment of the present invention, the uneven portion whose average surface roughness is 3.0 or more and 6.0 or less is formed in the hydrophobizing step. If an uneven portion having this average surface roughness can be formed, it is possible to make a contact angle between the inner peripheral surface and a liquid droplet larger than a contact angle between a surface having no uneven portion and a liquid droplet. In other words, it is possible to make the hydrophobicity of the inner peripheral surface better than a surface at which the uneven portion is not formed.

Therefore, it is possible to prevent liquid droplets, which have scattered from the substrate and which have been received by the inner peripheral surface of the tubular guard, from staying on the inner peripheral surface. It is possible to reduce the amount of liquid droplets remaining on the inner peripheral surface of the tubular guard, and therefore it is possible to excellently prevent the scattering of liquid droplets from the inner peripheral surface toward the substrate, which is caused by a collision between liquid droplets newly scattering from the substrate and liquid droplets remaining on the inner peripheral surface.

In still another preferred embodiment of the present invention, the hydrophobizing step includes a cutting member moving step of moving a cutting member by a predetermined sending distance along the inner peripheral surface per predetermined sending period of time while rotating the tubular guard around a central axis of the inner peripheral surface, and a cutting step of moving the cutting member by the sending distance, thereafter pushing the cutting member to the inner peripheral surface by a predetermined push amount, then cutting the inner peripheral surface, and forming a circular groove portion.

It is possible to form circular groove portions each of which has a certain depth with certain intervals between the circular groove portions by simply moving the cutting member. Therefore, it is possible to improve uniformity in size of the uneven portion formed at the inner peripheral surface.

The aforementioned or still other objects, features, and effects of the present invention will be clarified by the following description of a preferred embodiment given below with reference to the accompanying drawings.

BRIEF DESCRIPTION OF THE DRAWINGS

FIG. 20C is a schematic view shown to describe a third modification of the uneven portion.

FIG. 20D is a schematic view shown to describe a fourth modification of the uneven portion.

FIG. 20E is a schematic view shown to describe a fifth modification of the uneven portion.

DETAILED DESCRIPTION OF THE PREFERRED EMBODIMENTS

Figure 1:
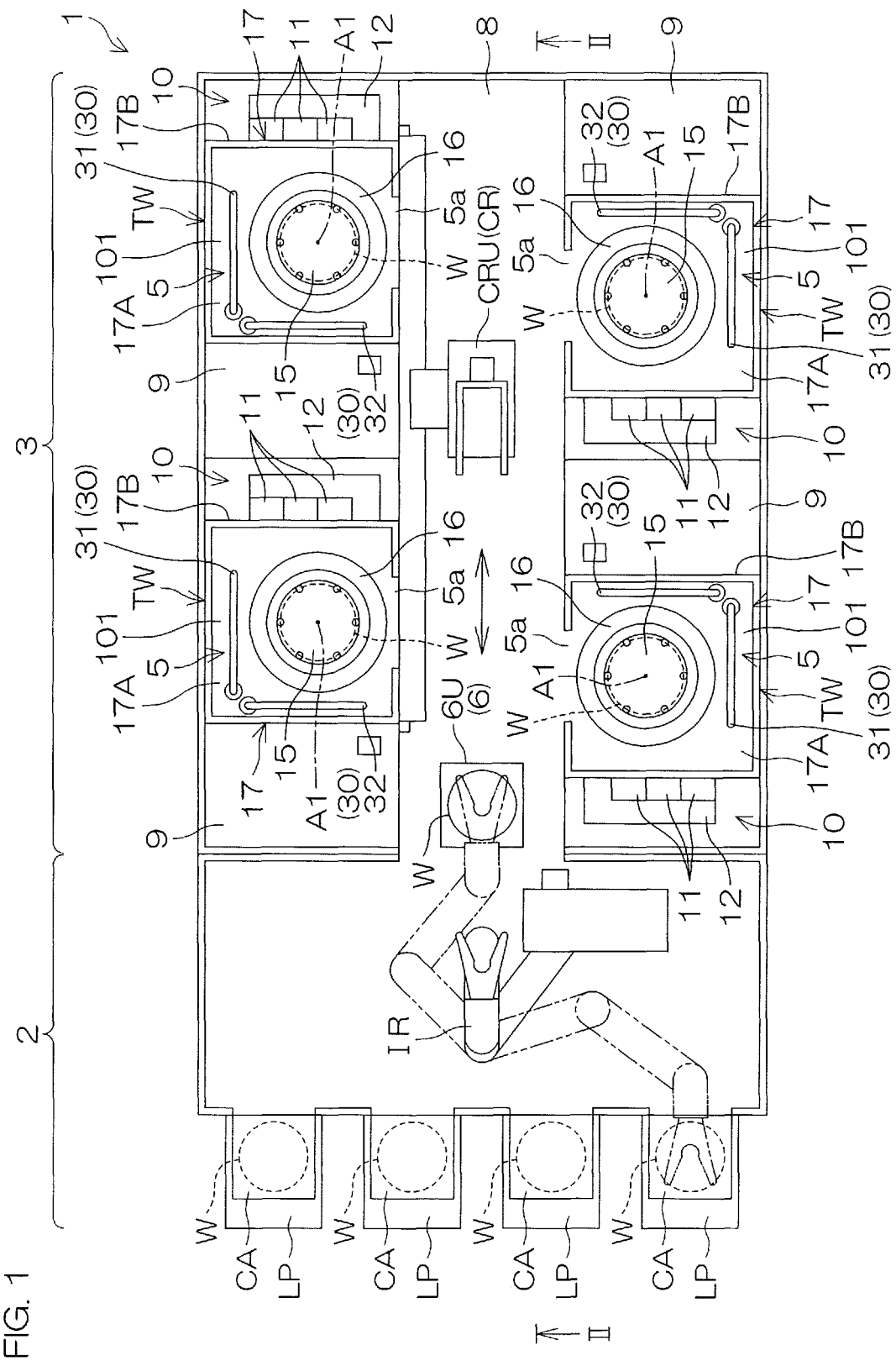
FIG. 1 is an illustrative plan view showing an internal configuration of a substrate processing apparatus according to a preferred embodiment of the present invention.
Figure 2:
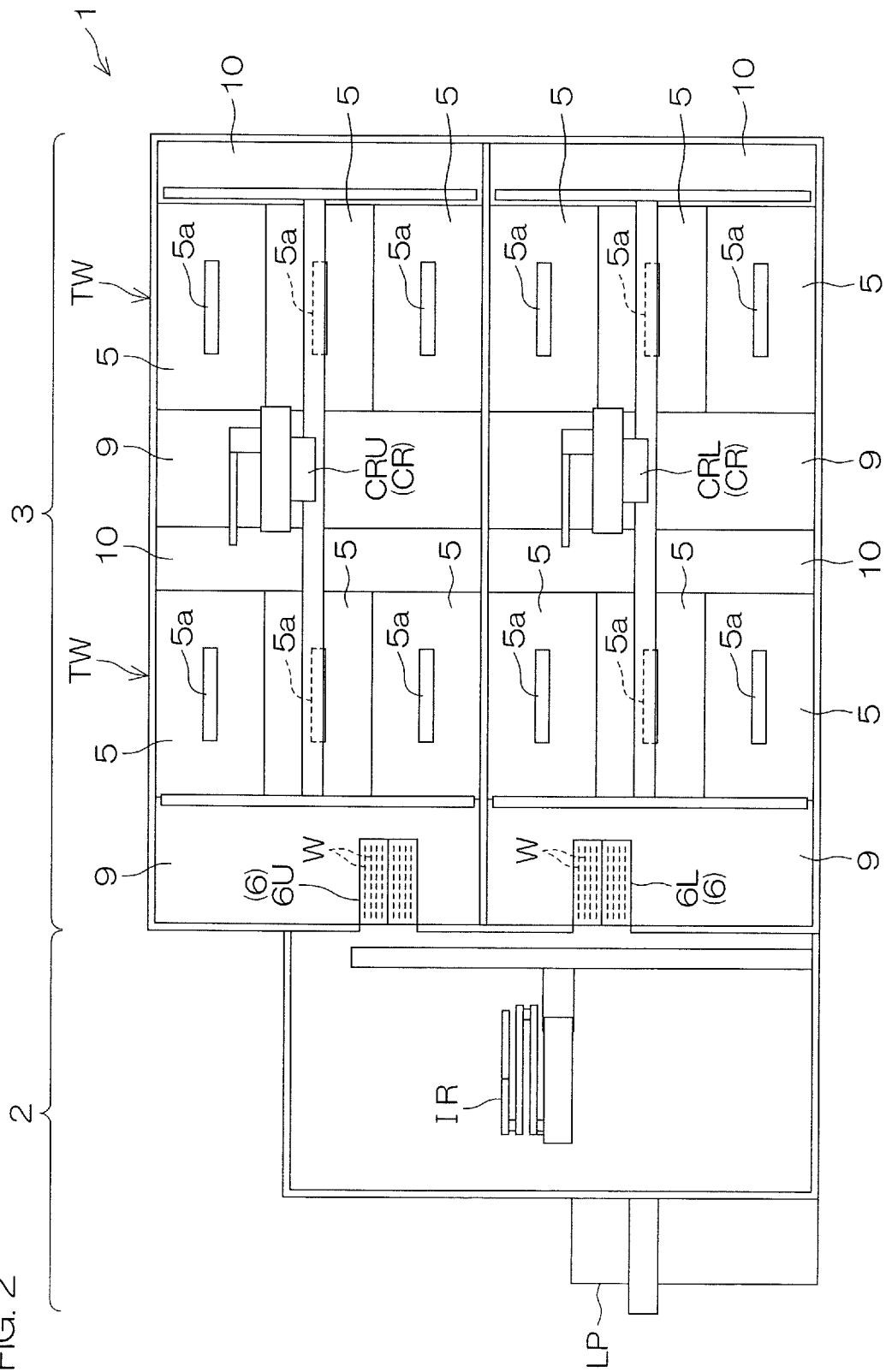
FIG. 2 is an illustrative longitudinal sectional view seen from line II-II of FIG. 1.

FIG. 1 is an illustrative plan view showing an internal configuration of a substrate processing apparatus 1 according to a preferred embodiment of the present invention. FIG. 2 is an illustrative longitudinal sectional view seen from line II-II of FIG. 1.

The substrate processing apparatus 1 includes an indexer block 2, a processing block 3 that is adjacent to the indexer block 2 in a lateral direction (horizontal direction) of the indexer block 2, and a controller 4 (see FIG. 10 described later) that controls the substrate processing apparatus 1.

The indexer block 2 includes a plurality of (in the present preferred embodiment, four) load ports LP and an indexer robot IR.

The load ports LP are arranged side by side along the horizontal direction. Each of the load ports LP is enabled to hold one carrier CA. The carrier CA is a substrate container that houses a to-be-processed substrate W. The substrate W is, for example, a semiconductor wafer.

The indexer robot IR is enabled to access the carriers CA respectively held by the load ports LP, and then carry in/out the substrates W, and transfer the substrates W between the indexer robot IR and the processing block 3. In the present preferred embodiment, the indexer robot IR is an articulated-arm robot including an articulated arm.

The processing block 3 includes a plurality of (in the present preferred embodiment, twelve) processing units 5, a plurality of substrate placing portions 6 (first substrate placing portion 6U and second substrate placing portion 6L), and a plurality of main transfer robots CR (first main transfer robot CRU and second main transfer robot CRL).

The processing units 5 process substrates W. In the present preferred embodiment, each of the processing units 5 is a single substrate processing type unit that processes substrates W one by one.

The processing units 5 are arranged on both sides of a transfer space 8 in which substrates W are transferred by the main transfer robots CR along the transfer space 8, and face the transfer space 8. The transfer space 8 rectilinearly extends in a direction away from the indexer block 2 in a plan view.

The processing units 5 form a plurality of (in the present preferred embodiment, four) processing towers TW. A plurality of (in the present preferred embodiment, two) processing towers TW are respectively disposed on both sides of the transfer space 8 in a plan view. Each of the processing towers TW includes a plurality of (in the present preferred embodiment, six) processing units 5 stacked together in an up-down direction. In the present preferred embodiment, twenty-four processing units 5 are disposed so as to be divided and included in four processing towers TW each of which includes six processing units 5. All processing units 5 have substrate carry-out/carry-in ports 5a, respectively, at positions facing the transfer space 8.

A fluid supply portion 9 and an exhaust portion 10 are disposed beside each of the processing towers TW. The fluid supply portion 9 houses pipes through which a processing fluid used in the processing units 5 forming the processing tower TW is supplied and pumps by which liquids in the pipes are sent. The exhaust portion 10 houses pipes through which atmospheres inside the processing units 5 forming the processing tower TW are discharged.

The processing fluid is a liquid (processing liquid) or a gas that is used in the substrate processing apparatus 1. A chemical liquid, a rinse liquid, and the like, which are described later, can be mentioned as the processing liquid.

An exhaust pipe 11 through which exhaust gases discharged from the processing units 5 of which a corresponding processing tower TW is composed are guided to exhaust equipment installed outside the substrate processing apparatus 1 in a plan view is housed in the exhaust portion 10. A switching mechanism 12 that performs switching from the exhaust pipe 11 to another in accordance with the kind of processing performed in the processing unit 5 (in more detail, the kind of the processing liquid) may be additionally housed together in the exhaust portion 10. Actuators (not shown) that drive the switching mechanism 12 are housed in the exhaust portion 10.

The processing units 5 are classified into low-level processing units 5 or high-level processing units 5. In the present preferred embodiment, lower three processing units 5 are low-level processing units, and upper three processing units 5 are high-level processing units 5.

The first substrate placing portion 6U and the second substrate placing portion 6L are arranged side by side in the up-down direction. The first main transfer robot CRU and the second main transfer robot CRL are arranged side by side in the up-down direction in the transfer space 8.

The first substrate placing portion 6U temporarily holds a substrate W that is handed between the indexer robot IR and the first main transfer robot CRU. The second substrate placing portion 6L temporarily holds a substrate W that is handed between the indexer robot IR and the second main transfer robot CRL.

The first main transfer robot CRU transfers a substrate W between the first substrate placing portion 6U and the high-level processing unit 5. The second main transfer robot CRL transfers a substrate W between the second substrate placing portion 6L and the low-level processing unit 5.

The processing unit 5 includes a spin chuck 15 that rotates a substrate W around a rotational axis A1 (vertical axis) while horizontally holding the substrate W, a processing cup 16 surrounding the spin chuck 15 in a plan view, and a processing chamber 17 that houses the spin chuck 15 and the processing cup 16. The rotational axis A1 is a vertical straight line passing through a central portion of the substrate W. The spin chuck 15 is an example of a rotational holding member.

The processing chamber 17 includes a lower wall 17A, a plurality of (in the present preferred embodiment, four) sidewalls 17B, and an upper wall 17C (see FIG. 3 described later), and an internal space 101 of the processing chamber 17 is defined by these walls. The substrate carry-out/carry-in port 5a is formed in the sidewall 17B of the processing chamber 17.

Figure 3:
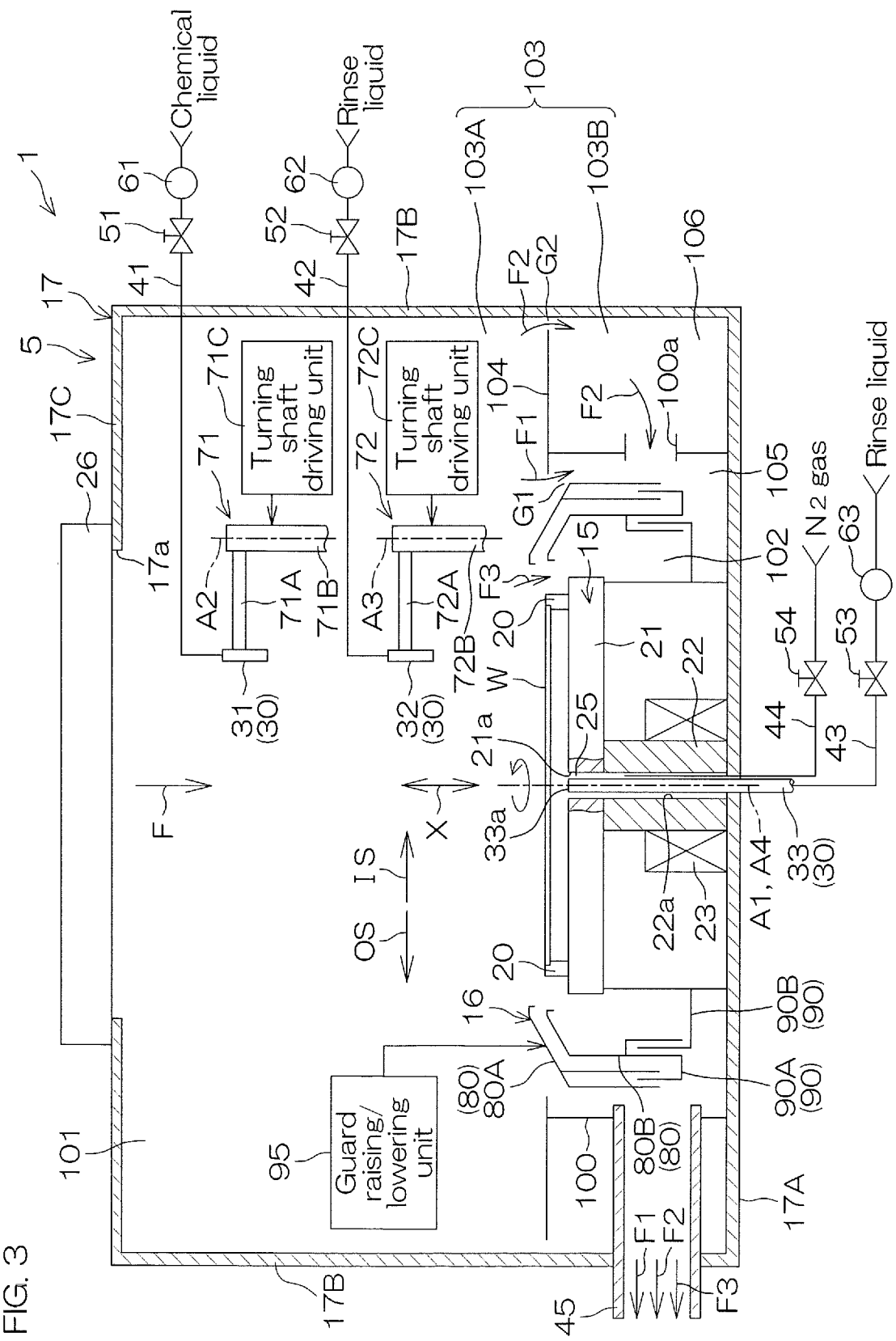
FIG. 3 is an illustrative cross-sectional view shown to describe a configuration example of a processing unit included in the substrate processing apparatus.

FIG. 3 is an illustrative cross-sectional view shown to describe a configuration example of the processing unit 5.

The spin chuck 15 includes a plurality of chuck pins 20, a spin base 21, a rotational shaft 22, and a spin motor 23.

The spin base 21 has a disk shape along the horizontal direction. The spin base 21 has a circular shape larger in diameter than the substrate W in a plan view. The chuck pins 20 grasping a peripheral edge of the substrate W are spaced out in a circumferential direction of the spin base 21 on an upper surface of the spin base 21. The chuck pin 20 is also referred to as a gripping pin.

The spin base 21 and the chuck pins 20 compose a substrate holding unit that horizontally holds the substrate W. The substrate holding unit is also referred to as a substrate holder.

The rotational shaft 22 extends in a vertical direction along the rotational axis A1. An upper end portion of the rotational shaft 22 is joined to the center of a lower surface of the spin base 21. The spin motor 23 gives a rotational force to the rotational shaft 22. The rotational shaft 22 is rotated by the spin motor 23, and, as a result, the spin base 21 is rotated. Hence, the substrate W is rotated around the rotational axis A1. The spin motor 23 is an example of a substrate rotating unit that rotates the substrate W around the rotational axis A1.

The processing unit 5 includes a plurality of processing liquid nozzles 30 and a fan filter unit (FFU) 26. The processing liquid nozzles 30 are housed in the processing chamber 17.

The FFU 26 is attached to an opening 17a formed in the upper wall 17C of the processing chamber 17, and is an example of a blower unit that sends clean air to the inside of the processing chamber 17. The FFU 26 includes a fan (not shown) that generates airflow toward the inside of the processing chamber 17 from outside the processing chamber 17, a filter (not shown) by which foreign substances included in the airflow are removed, and an actuator (not shown) such as a motor that drives a fan.

Each of the processing liquid nozzles 30 is an example of a liquid supply member that supplies a liquid to the substrate W held by the spin chuck 15. A chemical liquid nozzle 31 that discharges a chemical liquid toward the upper surface of the substrate W, an upper rinse liquid nozzle 32 that discharges a rinse liquid toward the upper surface of the substrate W, and a lower rinse liquid nozzle 33 that discharges a rinse liquid toward the lower surface of the substrate W are included in the processing liquid nozzles 30.

The chemical liquid nozzle 31 is connected to a chemical liquid pipe 41 that guides a chemical liquid to the chemical liquid nozzle 31. A chemical liquid valve 51 that opens and closes a flow passage of the chemical liquid and a chemical liquid pump 61 that sends the chemical liquid to the chemical liquid nozzle 31 are interposed in the chemical liquid pipe 41. When the chemical liquid valve 51 is opened, the chemical liquid is discharged downwardly from the chemical liquid nozzle 31 in a continuous flow.

In the present preferred embodiment, the chemical liquid nozzle 31 is a moving nozzle that is moved by a first nozzle moving unit 71 in the horizontal direction and in the vertical direction. The chemical liquid nozzle 31 is enabled to move in the horizontal direction between a center position and a home position (retreat position). When the chemical liquid valve 51 is opened when the chemical liquid nozzle 31 is placed in the center position, a chemical liquid is supplied to a central region of an upper surface of a substrate W.

The first nozzle moving unit 71 may include an arm 71A that is joined to the chemical liquid nozzle 31 and that horizontally extends, a turning shaft 71B that is joined to the arm 71A and that extends in the vertical direction, and a turning shaft driving unit 71C that raises and lowers the turning shaft.

The turning shaft driving unit 71C includes a drive motor (not shown) that swings the arm 71A by turning the turning shaft 71B around a turning axis A2 extending in the vertical direction and an arm lifter (not shown) that raises and lowers the arm 71A by raising and lowering the turning shaft 71B in the vertical direction. The arm lifter is, for example, a ball screw mechanism or a rack-and-pinion mechanism.

Unlike the present preferred embodiment, the chemical liquid nozzle 31 may be a stationary nozzle whose position is fixed in the horizontal and vertical directions.

The chemical liquid discharged from the chemical liquid nozzle 31 may be a liquid including at least one among, for example, sulfuric acid, acetic acid, nitric acid, hydrochloric acid, hydrofluoric acid, ammonia water, hydrogen peroxide water, organic acid (e.g., citric acid, oxalic acid, etc.), organic alkali (e.g., tetramethylammonium hydroxide (TMAH), etc.), surfactant, and corrosion inhibitor. As an example of a chemical liquid in which these liquids are mixed together, SPM (sulfuric acid/hydrogen peroxide mixture), APM (ammonia-hydrogen peroxide mixture), etc., can be mentioned.

The upper rinse liquid nozzle 32 is connected to an upper rinse liquid pipe 42 that guides a rinse liquid to the upper rinse liquid nozzle 32. An upper rinse liquid valve 52 that opens and closes a flow passage of a rinse liquid and an upper rinse liquid pump 62 that sends a rinse liquid to the upper rinse liquid nozzle 32 are interposed in the upper rinse liquid pipe 42. When the upper rinse liquid valve 52 is opened, a rinse liquid is discharged downwardly from the upper rinse liquid nozzle 32 in a continuous flow.

In the present preferred embodiment, the upper rinse liquid nozzle 32 is a moving nozzle that is moved by a second nozzle moving unit 72 in the horizontal direction and in the vertical direction. The upper rinse liquid nozzle 32 is enabled to move in the horizontal direction between a center position and a home position (retreat position). When the upper rinse liquid valve 52 is opened when the upper rinse liquid nozzle 32 is placed in the center position, a rinse liquid is supplied to a central region of an upper surface of a substrate W.

The second nozzle moving unit 72 may include an arm 72A that is joined to the upper rinse liquid nozzle 32 and that horizontally extends, a turning shaft 72B that is joined to the arm 72A and that extends in the vertical direction, and a turning shaft driving unit 72C that raises and lowers the turning shaft 72B.

The turning shaft driving unit 72C includes a drive motor (not shown) that swings the arm 72A by turning the turning shaft 72B around a turning axis A3 extending in the vertical direction and an arm lifter (not shown) that raises and lowers the arm 72A by raising and lowering the turning shaft in the vertical direction. The arm lifter is, for example, a ball screw mechanism or a rack-and-pinion mechanism.

Unlike the present preferred embodiment, the upper rinse liquid nozzle 32 may be a stationary nozzle whose position is fixed in the horizontal and vertical directions.

The lower rinse liquid nozzle 33 is a stationary nozzle that discharges a rinse liquid toward a central portion of the lower surface of the substrate W. The lower rinse liquid nozzle 33 is inserted in a through-hole 21a that is opened at a central portion of the upper surface of the spin base 21 and in an internal space 22a of the rotational shaft 22 communicating with the through-hole 21a. A discharge port 33a of the lower rinse liquid nozzle 33 is exposed from the upper surface of the spin base 21.

The lower rinse liquid nozzle 33 is connected to a lower rinse liquid pipe 43 that guides a rinse liquid to the lower rinse liquid nozzle 33. A lower rinse liquid valve 53 that opens and closes the flow passage of a rinse liquid and a lower rinse liquid pump 63 that sends a rinse liquid to the lower rinse liquid nozzle 33 are interposed in the lower rinse liquid pipe 43. When the lower rinse liquid valve 53 is opened, a rinse liquid is discharged upwardly from the lower rinse liquid nozzle 33 in a continuous flow.

DIW, carbonated water, electrolyzed ion water, hydrochloric acid water having a diluted concentration (for example, about 1 ppm to 100 ppm), ammonia water having a diluted concentration (for example, about 1 ppm to 100 ppm), restoration water (hydrogenated water), etc., can be mentioned as the rinse liquid.

A lower gas flow passage 25 is defined by a space between the lower rinse liquid nozzle 33 and the through-hole 21a of the spin base 21. The lower gas flow passage 25 is connected to a lower gas pipe 44 inserted in the internal space 22a between an inner peripheral surface of the rotational shaft 22 and the lower rinse liquid nozzle 33. When a lower gas valve 54 interposed in the lower gas pipe 44 is opened, a gas, such as nitrogen gas ($N_2$ gas), is discharged from the lower gas flow passage 25 toward a space between the lower surface of the substrate W and the upper surface of the spin base 21.

The gas discharged from the lower gas flow passage 25 is not limited to a nitrogen gas. The gas discharged from the lower gas flow passage 25 may be air. Additionally, the gas discharged from the lower gas flow passage 25 may be an inert gas other than the nitrogen gas. For example, the inert gas other than the nitrogen gas is argon.

The processing cup 16 includes a plurality of tubular guards 80 that receive a liquid scattering outwardly from the substrate W held by the spin chuck 15, a plurality of cups 90 that receive a liquid guided downwardly by the tubular guards 80, and an exhaust tub 100 surrounding the tubular guards 80 and the cups 90 in a plan view. The tubular guard 80 is an example of a liquid receiving member that receives a liquid scattering from the substrate W.

In the present preferred embodiment, an example is shown in which two tubular guards 80 (first tubular guard 80A and second tubular guard 80B) and two cups 90 (first cup 90A and second cup 90B) are provided.

The tubular guard 80 is made of resin. The tubular guard 80 is made of hydrophilic resin or hydrophobic resin. Preferably, the tubular guard 80 is made of hydrophobic resin.

The hydrophobic resin is, for example, fluorine resin. In detail, the tubular guard 80 is made of one chosen from among perfluoroalkoxyalkane (PFA), polytetrafluoroethylene (PTFE), polychlorotrifluoroethylene (PCTFE), and ethylene chlorotrifluoroethylene copolymer (ECTFE), or is made of a mixture containing two or more chosen from thereamong.

Each of the first and second cups 90A and 90B has the form of an annular groove opened upwardly.

Each of the first and second tubular guards 80A and 80B has a substantially tubular shape, and has its upper end portion inclined inwardly toward its center side. The first tubular guard 80A is disposed so as to surround the substrate W held by the spin chuck 15. The second tubular guard 80B (inner guard) is disposed so as to surround the substrate W held by the spin chuck 15 and so as to be closer to the center side of the first tubular guard 80A (outer guard) than the first tubular guard 80A.

The center side of the first tubular guard 80A (hereinafter, referred to as the "guard inside IS") is also the inside in a rotation radial direction of the substrate W. The side (hereinafter, referred to as the "guard outside OS") opposite to the center side of the first tubular guard 80A is also the outside in the rotation radial direction of the substrate W. The first and second tubular guards 80A and 80B are disposed coaxially, and the center side of the first tubular guard 80A is also the center side of the second tubular guard 80B.

The first cup 90A is formed integrally with the second tubular guard 80B, and receives a liquid guided downwardly by the first tubular guard 80A. The second cup 90B receives a liquid guided downwardly by the second tubular guard 80B. The liquid received by the first cup 90A is collected by a first processing-liquid collecting passage (not shown) connected to a lower end of the first cup 90A. The liquid received by the second cup 90B is collected by a second processing-liquid collecting passage (not shown) connected to a lower end of the second cup 90B.

The processing unit 5 includes a guard raising/lowering unit 95 that raises and lowers the first and second tubular guards 80A and 80B independently of each other. The guard raising/lowering unit 95 raises and lowers the first tubular guard 80A between a lower position and an upper position. The guard raising/lowering unit 95 raises and lowers the second tubular guard 80B between the lower position and the upper position.

When the first and second tubular guards 80A and 80B are both placed at the upper position, a liquid scattering from the substrate W is received by the second tubular guard 80B. When the second tubular guard 80B is placed at the lower position and when the first tubular guard 80A is placed at the upper position, a liquid scattering from the substrate W is received by the first tubular guard 80A.

When the first and second tubular guards 80A and 80B are both placed at the lower position, a corresponding one of the main transfer robots CR can carry a substrate W into the processing chamber 17 and can carry a substrate W out of the processing chamber 17.

The guard raising/lowering unit 95 includes a first guard raising/lowering unit that raises and lowers the first tubular guard 80A and a second guard raising/lowering unit that raises and lowers the second tubular guard 80B. The first guard raising/lowering unit is, for example, a first actuator (not shown) that gives a driving force to a first elevation mechanism (not shown) joined to the first tubular guard 80A. The first elevation mechanism is, for example, a ball screw mechanism or a rack-and-pinion mechanism. The second guard raising/lowering unit is a second actuator (not shown) that gives a driving force to a second elevation mechanism (not shown) joined to the second tubular guard 80B. The second elevation mechanism is, for example, a ball screw mechanism or a rack-and-pinion mechanism.

The guard raising/lowering unit 95 is referred to also as a "guard lifter." Similarly, the first guard raising/lowering unit is a first guard lifter, and the second guard raising/lowering unit is a second guard lifter.

The internal space 101 of the processing chamber 17 is divided into an inside-guard space 102 of the guard inside IS within the first tubular guard 80A and an outside-guard spaces 103 other than the inside-guard space 102. At least either one of the sidewalls 17B of the processing chamber 17 is provided with a partition plate 104 by which the outside-guard space 103 of the processing chamber 17 is partitioned into an upper part and a lower part. In other words, the outside-guard space 103 is divided by the partition plate 104 into an upper space 103A over the partition plate 104 and a lower space 103B under the partition plate 104. The partition plate 104 is supported by the exhaust tub 100.

The upper space 103A includes a space of the guard inside IS that is over the partition plate 104 and that is inside the first tubular guard 80A and a space of the guard outside OS that is over the partition plate 104 and that is outside the first tubular guard 80A.

The lower space 103B is divided into an inner lower space 105 of the guard inside IS inside the exhaust tub 100 and an outer lower space 106 of the guard outside OS outside the exhaust tub 100.

An atmosphere in the processing chamber 17 is discharged through an exhaust connection pipe 45 that passes through the sidewall 17B of the processing chamber 17 and the exhaust tub 100. The exhaust connection pipe 45 is connected to the exhaust pipe 11 (see FIG. 1) disposed at the exhaust portion 10.

The FFU 26 forms an airflow F by sending clean air to the internal space 101 of the processing chamber 17. The airflow F is sent from the upper space 103A to the exhaust connection pipe 45 of the exhaust portion 10 through the inside-guard space 102 or through the lower space 103B. The airflow F flows into the lower space 103B through a gap G1 between an end portion of the partition plate 104 in the guard inside IS and the first tubular guard 80A or through a gap G2 formed in another end portion of the partition plate 104 in the guard outside OS.

The airflow F1 that has flowed into the inner lower space 105 through the gap G1 flows from the inner lower space 105 into the exhaust connection pipe 45.

The airflow F2 that has flowed into the outer lower space 106 through the gap G2 flows into the inner lower space 105 through an opening 100a formed in the exhaust tub 100, and then flows into the exhaust connection pipe 45. The airflow F3 that has flowed into the inside-guard space 102 flows from the inside-guard space 102 into the exhaust connection pipe 45.

It is possible to adjust the size of the gap G1 between the partition plate 104 and the first tubular guard 80A by adjusting the height position of the first tubular guard 80A. It is possible to adjust the flow rate of the airflows F1 to F3 by adjusting the size of the gap G1.

Figure 4:
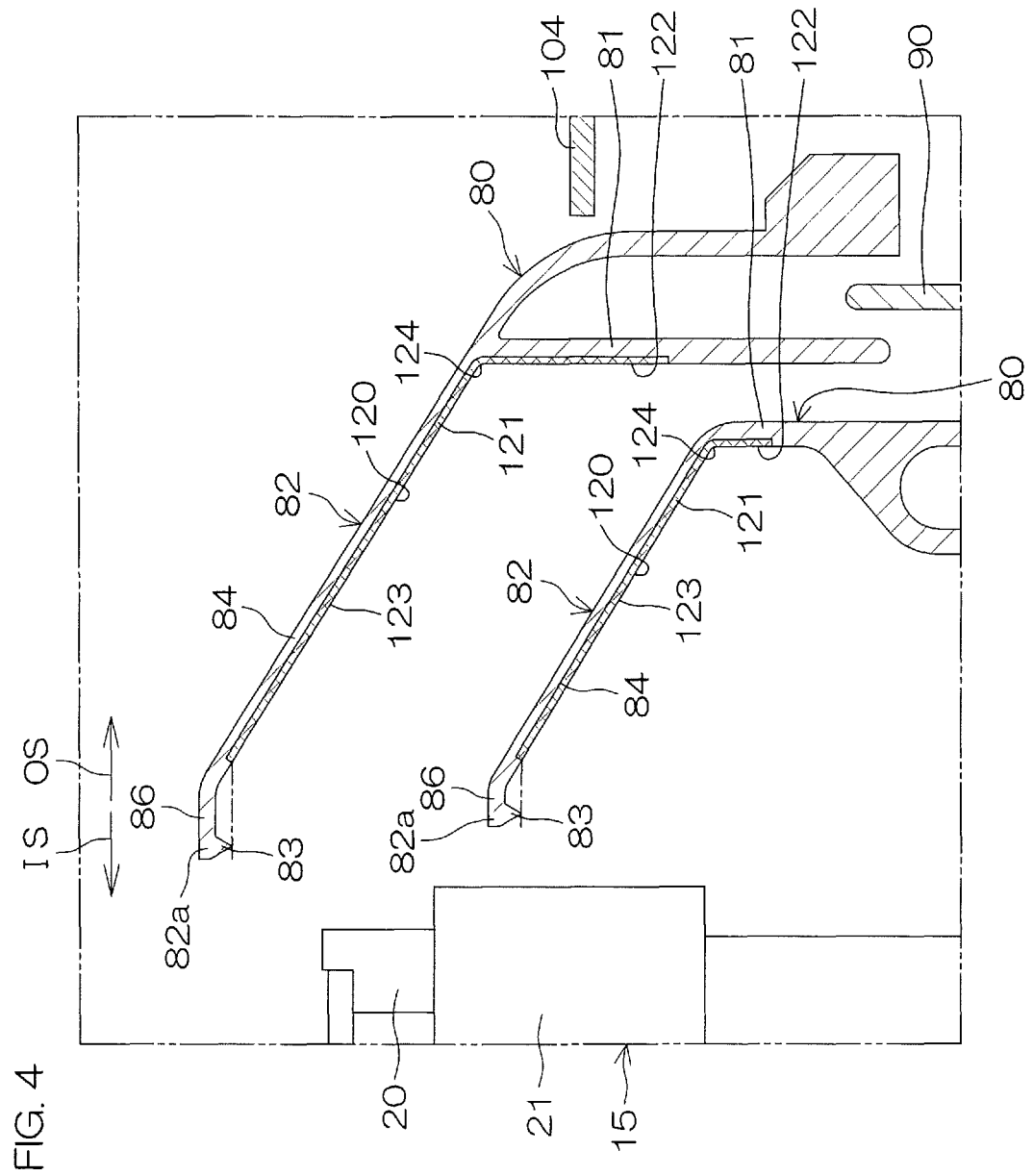
FIG. 4 is a schematic cross-sectional view shown to describe a configuration of a tubular guard included in the processing unit.

FIG. 4 is a schematic cross-sectional view shown to describe a configuration of the tubular guard 80.

Referring to FIG. 4, each of the tubular guards 80 includes a tubular portion 81, an extensional portion 82, and a drooping portion 83.

The tubular portion 81 is a circularly tubular portion (cylindrical portion) that has a circular shape in a plan view. The tubular portion 81 surrounds the spin chuck 15. The center side of the tubular portion 81 is also the guard inside IS, and the side opposite to the center side of the tubular portion 81 is also the guard outside OS.

The extensional portion 82 has a circular ring shape in a plan view. The extensional portion 82 is connected to an upper end portion of the tubular portion 81, and extends from the upper end portion of the tubular portion 81 toward the center side of the tubular portion 81.

The drooping portion 83 is connected directly to an end portion (hereinafter, referred to as a "center-side end portion 82a") of the extensional portion 82 on the center side of the tubular portion 81, and extends downwardly from the center-side end portion 82a. The drooping portion 83 has a circular ring shape in a plan view. The drooping portion 83 has a tapered shape in which its width becomes smaller in proportion to a downward progression. The drooping portion 83 has a triangular shape in a cross-sectional view.

The extensional portion 82 has an inclined portion 84 that extends obliquely upwardly toward the guard inside IS and a horizontal portion 86 that extends horizontally at a higher position than the inclined portion 84 and that is connected to an upper end portion of the drooping portion 83. Unlike the example of FIG. 4, the drooping portion 83 may be connected directly to an upper end portion of the inclined portion 84 without the horizontal portion 86.

The tubular guard 80 has an inner peripheral surface 120 and an uneven portion 121 disposed at the inner peripheral surface 120. The inner peripheral surface 120 of the tubular guard 80 is composed of a tubular surface 122 that is an inner peripheral surface of the tubular portion 81, an inclined surface 123 that is an inner peripheral surface of the inclined portion 84, and a curved surface 124 that smoothly connects the tubular surface 122 and the inclined surface 123. The tubular surface 122 is a circularly tubular surface extending in the vertical direction. The inclined surface 123 is connected to an upper end of the tubular surface 122 through the curved surface 124, and extends while being inclined with respect to the tubular surface 122. In detail, the inclined surface 123 extends obliquely upwardly from an upper end portion of the curved surface 124 toward the guard inside IS. Unlike the example of FIG. 4, the inclined surface 123 may be connected directly to the upper end of the tubular surface 122 without the curved surface 124.

The uneven portion 121 is disposed at both the inclined surface 123 and the tubular surface 122. The uneven portion 121 is disposed in an area below a lower end portion of the drooping portion 83 in the inner peripheral surface 120.

Figure 5:
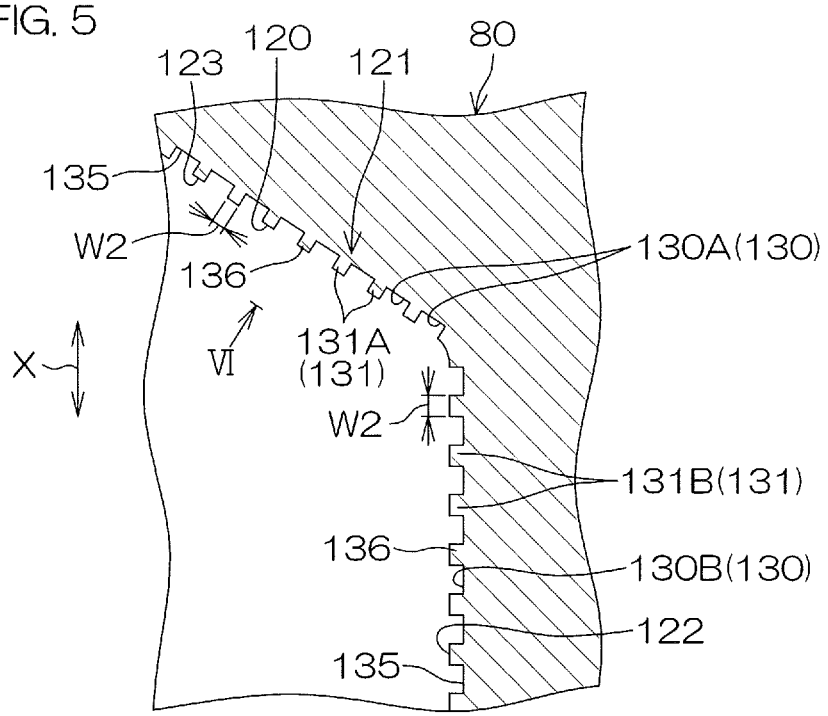
FIG. 5 is an enlarged view of the vicinity of an inner peripheral surface of a cross section of the tubular guard.
Figure 6:
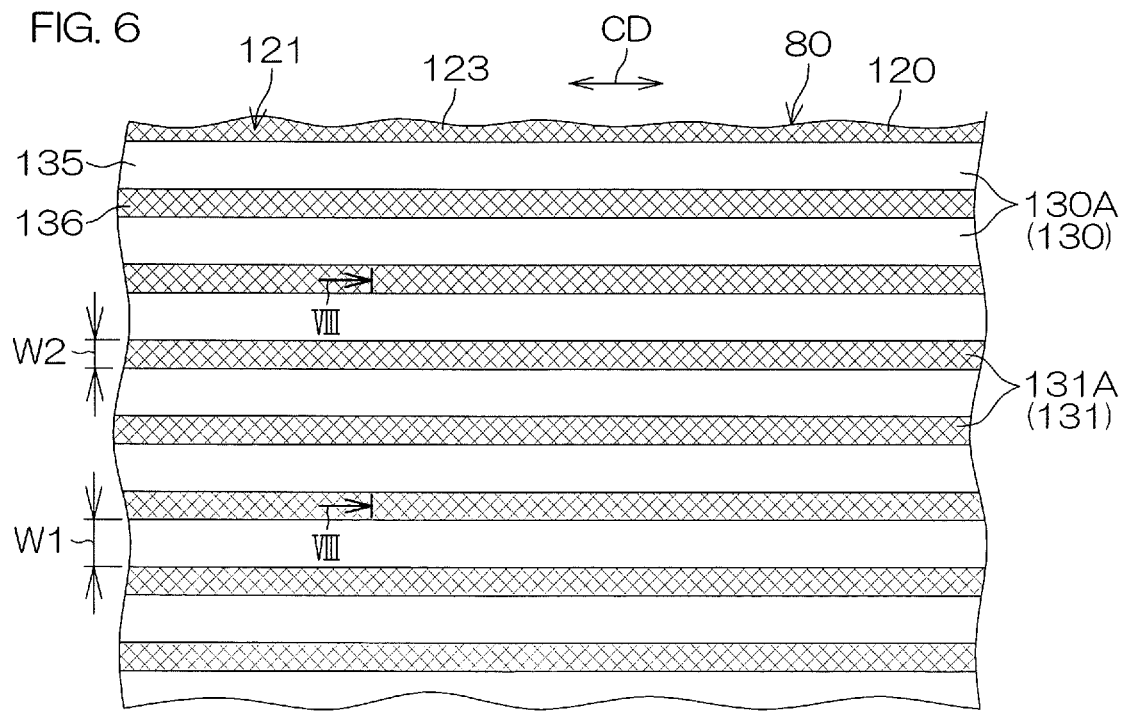
FIG. 6 is a view seen from arrow VI that indicates an uneven portion in FIG. 5.
Figure 7:
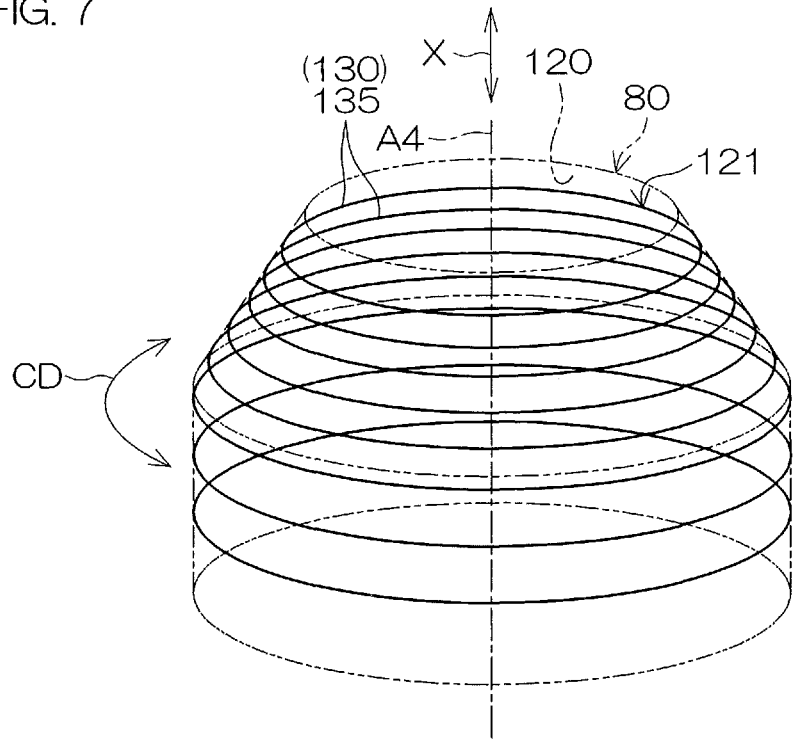
FIG. 7 is a schematic perspective view shown to describe the shape of the uneven portion disposed at the inner peripheral surface of the tubular guard.

FIG. 5 is an enlarged view of the vicinity of the inner peripheral surface 120 of a cross section of the tubular guard 80. FIG. 6 is a view of the uneven portion 121 seen from arrow VI of FIG. 5. FIG. 7 is a schematic perspective view shown to describe the shape of the uneven portion 121 disposed at the inner peripheral surface 120 of the tubular guard 80.

The uneven portion 121 has a plurality of recessed portions 130 and a plurality of protruding portions 131 placed between the recessed portions 130 adjacent to each other as shown in FIG. 5 and FIG. 6. In the present preferred embodiment, the recessed portion 130 is a circular groove portion 135 along a circumferential direction CD of the inner peripheral surface 120 as shown in FIG. 7. Likewise, the protruding portion 131 is a circular protruding portion 136 (see FIG. 6) along the circumferential direction CD of the inner peripheral surface 120. The circular groove portions 135 are disposed at the inner peripheral surface 120 with intervals between the circular groove portions 135 in an axial direction X.

The recessed portions 130 are disposed at the inner peripheral surface 120 with intervals between the recessed portions 130 in the axial direction X along the central axis A4 (see FIG. 7) of the inner peripheral surface 120. The central axis A4 coincides with the rotational axis A1 (see FIG. 3).

Referring to FIG. 5 and FIG. 6, the recessed portion 130, which is one among the recessed portions 130 and which is formed at the inclined surface 123, is referred to as the first recessed portion 130A, and the recessed portion 130, which is one among the recessed portions 130 and which is formed at the tubular surface 122, is referred to as the second recessed portion 130B. The protruding portion 131, which is one among the protruding portions 131 and which is placed between the first recessed portions 130A, is referred to as the first protruding portion 131A, and the protruding portion 131, which is one among the protruding portions 131 and which is placed between the second recessed portions 130B, is referred to as the second protruding portion 131B.

Figure 8:
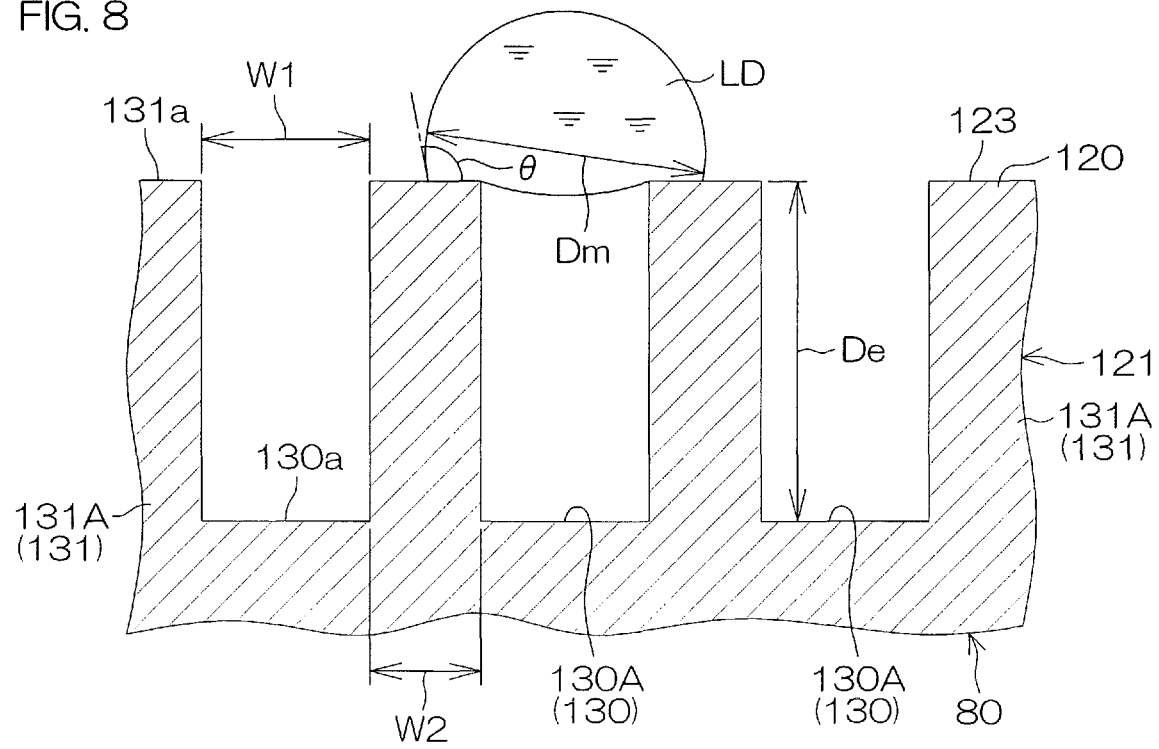
FIG. 8 is a schematic view that corresponds to a cross section along line VIII-VIII of FIG. 6 and that is shown to describe a configuration of the uneven portion.

FIG. 8 is a schematic view that corresponds to a cross section along line VIII-VIII of FIG. 6 and that is shown to describe a configuration of the uneven portion 121.

Referring to FIG. 8, the recessed portion 130 has a width W1 smaller than a diameter Dm of a liquid droplet LD and a depth De in which the liquid droplet LD is not in contact with a bottom portion 130a of the recessed portion 130 in a state in which the liquid droplet LD is in contact with the protruding portions 131. The protruding portion 131 has a width W2 that is smaller than the diameter Dm of the liquid droplet LD and that is smaller than the width W1 of the recessed portion 130.

Therefore, the liquid droplet LD received by the uneven portion 121 of the inner peripheral surface 120 does not completely enter the recessed portion 130, and is in contact with the protruding portions 131. The recessed portion 130 has a depth De in which the liquid droplet LD does not come into contact with the bottom portion 130a of the recessed portion 130 in a state in which the liquid droplet LD is in contact with the protruding portions 131. If the uneven portion 121 and the liquid droplet LD have this dimensional relationship, it is possible to bring the liquid droplet LD into contact with air existing in the recessed portion 130 and to reduce an area in which the liquid droplet LD comes into contact with the inner peripheral surface 120 of the tubular guard 80.

Therefore, it is possible to make the contact angle θ of the liquid droplet LD with respect to the uneven portion 121 larger than the contact angle of the liquid droplet LD with respect to an inner peripheral surface at which the uneven portion 121 is not formed. In other words, it is possible to make the hydrophobicity of the inner peripheral surface 120 of the tubular guard 80 better than an inner peripheral surface at which the uneven portion 121 is not formed. If the tubular guard 80 is made by use of a hydrophobic resin, it is possible to further improve the hydrophobicity of the inner peripheral surface 120.

The contact angle θ is an angle made in the liquid droplet LD between the air-liquid interface of the liquid droplet LD and the interface between the uneven portion 121 and the liquid droplet LD. Preferably, the contact angle θ is, for example, 99° or more if a liquid forming the liquid droplet LD is water.

Figure 9:
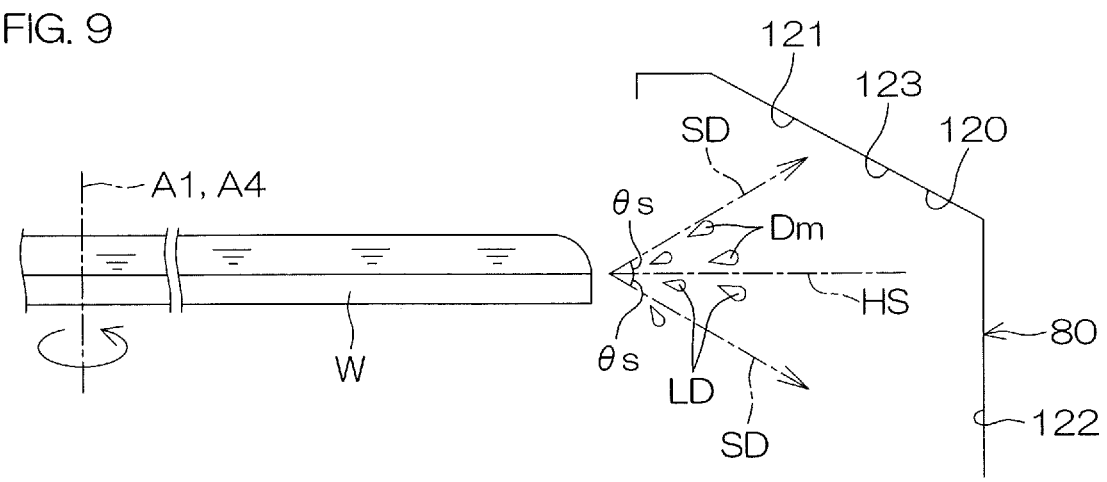
FIG. 9 is a schematic view shown to describe a state in which liquid droplets are scattering from a substrate.

Next, a description will be given of concrete numerical values of the scattering angle θs of a liquid droplet LD scattering from a substrate W and the diameter Dm of the liquid droplet LD scattering therefrom. FIG. 9 is a schematic view shown to describe a state in which liquid droplets are scattering from a substrate W.

A liquid scatters from a peripheral edge of the substrate W to the outside of the substrate W by rotating the substrate W in a state in which a liquid exists on the upper surface of the substrate W. The diameter Dm of a liquid droplet LD scattering from the substrate W and the scattering angle θs of the liquid droplet LD depends on the rotation speed of the substrate W. The scattering angle θs is an angle between a horizontal plane HS and a scattering direction SD of the liquid droplet LD.

Most liquid droplets LD scatter obliquely downwardly if the rotation speed of the substrate W is lower than 600 rpm. Most liquid droplets LD are received by the tubular surface 122 if the rotation speed of the substrate W is lower than 600 rpm. On the other hand, most liquid droplets LD scatter obliquely upwardly if the rotation speed of the substrate W is 600 rpm or more. Therefore, most liquid droplets LD are received by the inclined surface 123 if the rotation speed of the substrate W is 600 rpm or more.

The diameter Dm of a liquid droplet LD scattering from the substrate W is changed by the supply flow rate of a liquid to the substrate W and by shear energy. The shear energy is changed by the rotation speed of the substrate W and by the diameter of the substrate W. The diameter of the substrate W is roughly 300 mm. The diameter Dm of a liquid droplet LD scattering from the substrate W is roughly 0.1 mm or more and 3.0 mm or less. The diameter Dm of the liquid droplet LD scattering from the substrate W is 0.1 mm or more and 1.5 mm or less if the rotation speed of the substrate W is 600 rpm or more and 1200 rpm or less.

Preferably, the depth De of the recessed portion 130 is 1 mm or less and 10 μm or more in order to prevent the entry of a liquid droplet LD whose diameter Dm is 1.5 mm or less into the recessed portion 130. Additionally, preferably, the width W1 of the recessed portion 130 is 100 μm or more, and is smaller than 1.5 mm. Still additionally, preferably, the width W2 of the protruding portion 131 is 1.0 μm or more, and is smaller than 1.5 mm.

The diameter Dm of a liquid droplet LD scattering from the substrate W is chiefly 1.0 mm or less if the rotation speed of the substrate W is 600 rpm or more and 1200 rpm or less. In order to further prevent the entry of a liquid droplet LD whose diameter Dm is 1.0 mm or less into the recessed portion 130, it is preferable for the depth De of the recessed portion 130 to be 1.0 mm or less and 10 μm or more in the same way as under the condition for preventing the entry of a liquid droplet LD whose diameter Dm is 1.5 mm or less into the recessed portion 130. Additionally, more preferably, the width W1 of the recessed portion 130 is 100 μm or more and is smaller than 1.0 mm, and, more preferably, the width W2 of the protruding portion 131 is 1.0 μm or more and is smaller than 1.0 mm.

In order to form the uneven portion 121 having this size, the average surface roughness of the uneven portion 121 is required to be set at 3.0 or more and 6.0 or less. If the average surface roughness Ra is 6.0 or less, the width W1 of the recessed portion 130 becomes sufficiently small, and it is possible to effectively prevent the entry of a liquid droplet LD whose diameter Dm is 1.5 mm or less into the recessed portion 130. If the average surface roughness Ra is 3.0 or more, the depth De of the recessed portion 130 becomes sufficiently large, and it is possible to effectively prevent the entry of a liquid droplet LD whose diameter Dm is 1.5 mm or less into the recessed portion 130. Particularly, the average surface roughness Ra is preferably 3.8.

Preferably, the depth De of the recessed portion 130 is 10 μm or more and 200 μm or less in order to set the average surface roughness Ra at 3.0 or more and 4.0 or less. Additionally, preferably, the width W1 of the recessed portion 130 is 100 μm or more and is smaller than 1.0 mm, and, preferably, the width W2 of the protruding portion 131 is 30 μm or more and 40 μm or less.

Therefore, preferably, the uneven portion 121 is formed at least at the inclined surface 123 in the inner peripheral surface 120 when the upper surface of the substrate W is processed with a processing liquid while rotating the substrate W at a rotation speed of 600 rpm or more. Additionally, preferably, the depth De of the recessed portion 130 is 10 μm or more, and the width W1 of the recessed portion 130 is smaller than 1.5 mm, and the width W2 of the protruding portion 131 is smaller than the width of the recessed portion 130 and is smaller than 1.5 mm.

The width W2 of the protruding portion 131 is narrowed by forming the uneven portion 121 whose average surface roughness Ra is high. In detail, it becomes 40 μm or less when the uneven portion 121 is machined so that the average surface roughness Ra of the uneven portion 121 becomes 6.0. Therefore, the uneven portion 121 whose average surface roughness Ra is 6.0 or less is more easily machined into the inner peripheral surface 120 than the uneven portion 121 whose average surface roughness Ra is larger than 6.0. Particularly when the uneven portion 121 is formed by a lathe rotation cutting, there is a distinct difference in processing easiness. Therefore, preferably, the average surface roughness Ra is 6.0 or less from the viewpoint of processing easiness.

Figure 10:
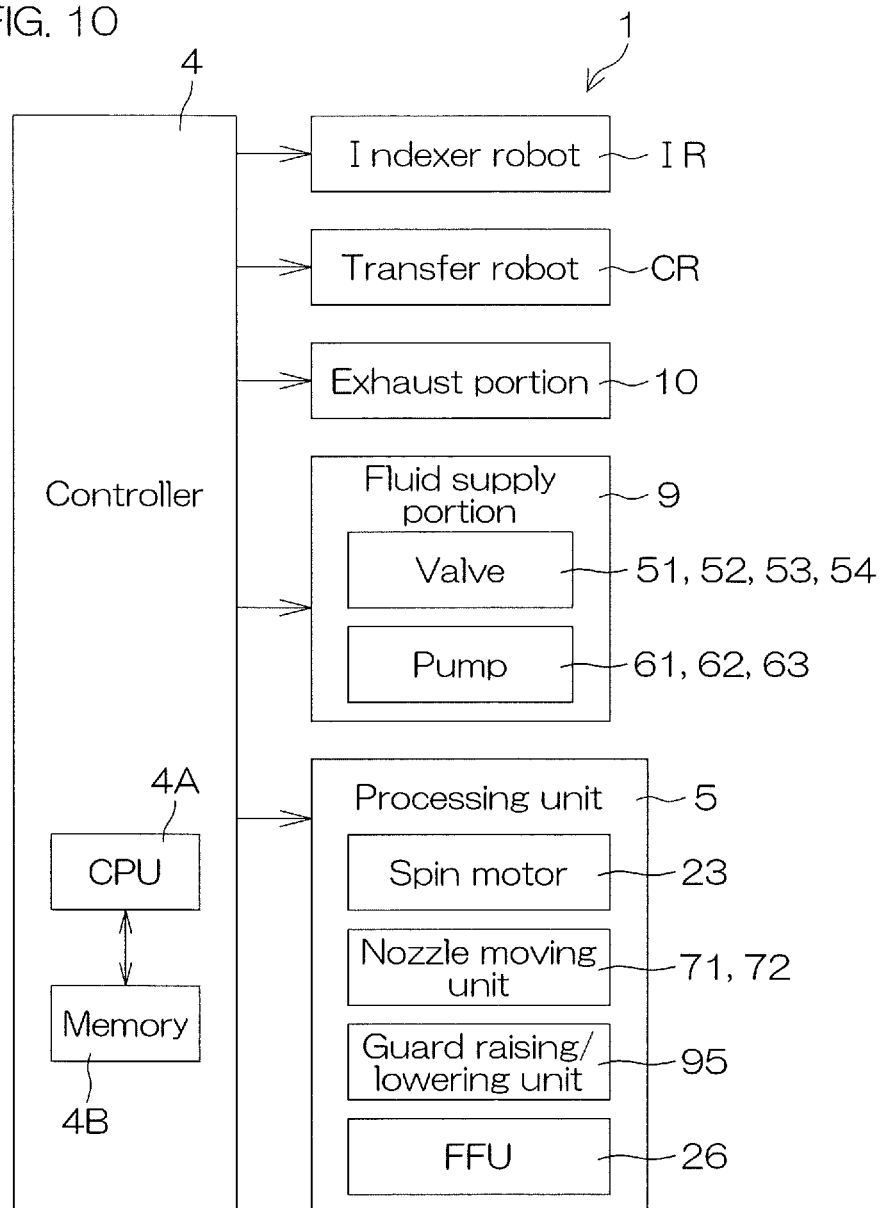
FIG. 10 is a block diagram showing an electrical configuration of a main portion of the substrate processing apparatus.

FIG. 10 is a block diagram showing an electrical configuration of a main portion of the substrate processing apparatus 1. The controller 4 includes a microcomputer, and controls to-be-controlled components included in the substrate processing apparatus 1 in accordance with a predetermined control program.

In detail, the controller 4 may be a computer that includes a processor (CPU) 4A and a memory 4B in which the control program is stored. The controller 4 is enabled to perform various control operations for substrate processing by allowing the processor 4A to execute the control program.

The indexer robot IR and the main transfer robots CR are included in the to-be-controlled components of the controller 4. Actuators disposed at the exhaust portion 10, valves disposed at the fluid supply portion 9 (chemical liquid valve 51, upper rinse liquid valve 52, lower rinse liquid valve 53, lower gas valve 54), and pumps disposed at the fluid supply portion 9 (chemical liquid pump 61, upper rinse liquid pump 62, lower rinse liquid pump 63) are included in the to-be-controlled components of the controller 4.

Additionally, each member included in the processing unit (spin motor 23, first nozzle moving unit 71, second nozzle moving unit 72, guard raising/lowering unit 95, FFU 26) are included in the to-be-controlled components of the controller 4.

Figure 11:
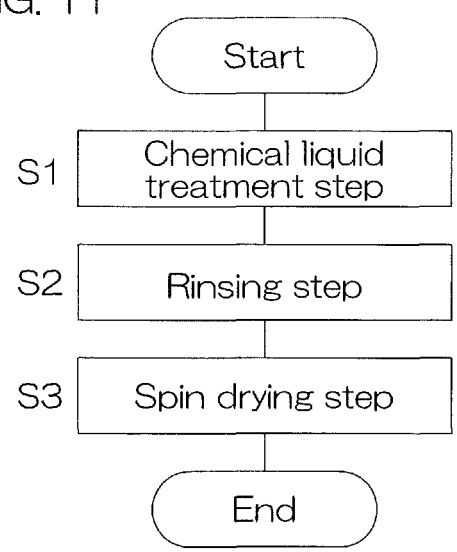
FIG. 11 is a flowchart shown to describe an example of substrate processing performed by the substrate processing apparatus.

FIG. 11 is a flowchart shown to describe an example of substrate processing performed by the substrate processing apparatus 1. In substrate processing by the substrate processing apparatus 1, for example, a chemical liquid treatment step (step S1), a rinsing step (step S2), and a spin drying step (step S3) are performed in this order as shown in FIG. 11.

Reference is hereinafter made chiefly to FIG. 3 and FIG. 11. First, a not-yet-processed substrate W is carried from the carrier CA into the processing unit 5, and is delivered to the spin chuck 15 by means of the indexer robot IR (see FIG. 1) and by means of either one of the main transfer robots CR (see FIG. 1). Hence, the substrate W is horizontally held by the spin chuck 15 (substrate holding step).

The holding of the substrate W by the spin chuck 15 is continued until the spin drying step (step S3) is ended. The guard raising/lowering unit 95 adjusts the height position of the first and second tubular guards 80A and 80B so that at least one of the tubular guard 80 is placed at the upper position during a period of time from the start of the substrate holding step to the end of the spin drying step (step S3). The spin motor 23 rotates the spin base 21 in a state in which the substrate W is being held by the spin chuck 15. Hence, the horizontally-held substrate W starts being rotated (substrate rotating step). The rotation speed of the substrate W is, for example, 600 rpm or more and 1200 rpm or less.

Thereafter, the lower gas valve 54 is opened, and a gas is discharged from the lower gas flow passage 25 (gas discharge step). The lower gas valve 54 is maintained in an opened state until the spin drying step (step S3) is ended. The flow rate of the gas from the lower gas flow passage 25 is, for example, 50 L/min. The exhaust flow rate is adjusted by the supply of the gas from the lower gas flow passage 25 and by the inflow of the gas by the FFU 26, and the inner pressure of the processing chamber 17 is adjusted to reach a predetermined pressure. The exhaust flow rate is, for example, 3 m³/min. In this case, the inner pressure of the processing chamber 17 is adjusted to be −30 Pa.

Thereafter, the chemical liquid treatment step (step S1) is performed in which the upper surface of the substrate W is treated with a chemical liquid.

In detail, the first nozzle moving unit 71 moves the chemical liquid nozzle 31 to a processing position. The processing position of the chemical liquid nozzle 31 is, for example, the center position.

The chemical liquid valve 51 is opened in a state in which the chemical liquid nozzle 31 is placed at the processing position. Hence, the chemical liquid is supplied (discharged) from the chemical liquid nozzle 31 toward the central area of the upper surface of the substrate W being in a rotational state (chemical liquid supplying step).

The chemical liquid that has been supplied to the upper surface of the substrate W receives a centrifugal force and then spreads radially, and is permeated throughout the entirety of the upper surface of the substrate W. The chemical liquid is discharged from the peripheral edge of the upper surface of the substrate W by means of a centrifugal force. Hence, the entirety of the upper surface of the substrate W is treated with the chemical liquid.

The chemical liquid discharged from the upper surface of the substrate W is chiefly received by the inclined surface 123 of either one of the first and second tubular guards 80A and 80B. The chemical liquid received by the inclined surface 123 moves downwardly along the inclined surface 123, and is guided to the tubular surface 122. The chemical liquid guided to the tubular surface 122 is finally received by a corresponding one of the cups 90.

Thereafter, the rinsing step (step S2) is performed in which the substrate W is washed with a rinse liquid. In detail, the chemical liquid valve 51 is closed, and then the first nozzle moving unit 71 moves the chemical liquid nozzle 31 to the home position. After the chemical liquid valve 51 is closed, the second nozzle moving unit 72 moves the upper rinse liquid nozzle 32 to the processing position. The processing position of the upper rinse liquid nozzle 32 is, for example, the center position.

The upper rinse liquid valve 52 is opened in a state in which the upper rinse liquid nozzle 32 is placed at the processing position. Hence, the rinse liquid is supplied (discharged) from the upper rinse liquid nozzle 32 toward the central area of the upper surface of the substrate W being in a rotational state (upper rinse liquid supplying step). The rinse liquid that has been supplied to the upper surface of the substrate W receives a centrifugal force and then spreads radially, and is permeated throughout the entirety of the upper surface of the substrate W. The rinse liquid is discharged from the peripheral edge of the upper surface of the substrate W by means of a centrifugal force. Hence, the entirety of the upper surface of the substrate W is washed by the rinse liquid (upper rinsing step).

The rinse liquid discharged from the upper surface of the substrate W is chiefly received by means of either of the inclined surface 123 of the first and second tubular guards 80A and 80B. The rinse liquid received by the inclined surface 123 moves downwardly along the inclined surface 123, and is guided to the tubular surface 122. The rinse liquid guided to the tubular surface 122 is finally received by a corresponding one of the cups 90.

When a rinse liquid is supplied to the upper surface of the substrate W, the lower rinse liquid valve 53 may be opened, and the rinse liquid may be discharged from the lower rinse liquid nozzle 33 (lower rinse liquid supplying step). Hence, the lower surface of the substrate W is washed by a rinse liquid (lower rinsing step).

Thereafter, the spin drying step (step S3) is performed in which the upper surface of the substrate W is dried while rotating the substrate W at a high speed. In detail, the upper and lower rinse liquid valves 52 and 53 are closed. Hence, the supply of the rinse liquid to the substrate W is stopped. Thereafter, the second nozzle moving unit 72 moves the upper rinse liquid nozzle 32 to the home position.

Thereafter, the spin motor 23 accelerates the rotation of the substrate W, and rotates the substrate W at a high speed (for example, 1500 rpm). As a result, a large centrifugal force acts on the liquid remaining on the upper and lower surfaces of the substrate W, and the liquid adhering to the substrate W is shaken off to the surroundings of the substrate W. The liquid shaken off from the substrate W is received by either of the first and second tubular guards 80A and 80B.

Thereafter, the spin motor 23 stops the rotation of the substrate W. The guard raising/lowering unit 95 moves the first and second tubular guards 80A and 80B to the lower position. Thereafter, the main transfer robot CR enters the processing unit 5, and scoops an already-processed substrate W from the chuck pin 20 of the spin chuck 15, and carries this substrate W out of the processing unit 5. This substrate W is delivered from the main transfer robot CR to the indexer robot IR, and is housed in the carrier CA by means of the indexer robot IR.

In the substrate processing apparatus 1, the uneven portion 121 is formed at the inner peripheral surface 120 of the tubular guard 80, and therefore the hydrophobicity of the inner peripheral surface 120 is improved. Therefore, it is possible to prevent the liquid droplet LD, which has scattered from the substrate W and which has been received by the inner peripheral surface 120 of the tubular guard 80, from staying on the inner peripheral surface 120. It is possible to reduce the amount of liquid droplets LD remaining on the inner peripheral surface 120 of the tubular guard 80, and therefore it is possible to excellently prevent the amount of liquid droplets LD scattering from the inner peripheral surface 120 toward the substrate W, which is caused by a collision between liquid droplets LD newly scattering from the substrate W and liquid droplets LD remaining on the inner peripheral surface 120.

The recessed portions 130 include the circular groove portions 135 along the circumferential direction CD of the inner peripheral surface 120. The circular groove portions 135 are disposed at the inner peripheral surface 120 with intervals between the circular groove portions 135 in the axial direction X. Therefore, it is possible to improve the hydrophobicity of the inner peripheral surface 120 in the whole area in the circumferential direction CD. Therefore, it is possible to thoroughly prevent the liquid droplet LD, which has scattered from the substrate W and which has been received by the inner peripheral surface 120 of the tubular guard 80, from remaining on the inner peripheral surface 120 in the whole area of the inner peripheral surface 120.

Additionally, according to the present preferred embodiment, the inner peripheral surface 120 of the tubular guard 80 has the tubular surface 122 extending in the vertical direction and the inclined surface 123 that is connected to the upper end of the tubular surface 122 and that extends obliquely with respect to the tubular surface 122. Additionally, the recessed portions 130 include the first recessed portions 130A formed at the inclined surface 123.

Liquid droplets LD scattering (being splashed back) from the inner peripheral surface of the tubular guard are liable to scatter obliquely downwardly, and therefore the re-adhesion of liquid droplets LD scattering from the inclined surface 123 to the substrate W tends to be more problematic than liquid droplets LD scattering from the tubular surface 122. In the present preferred embodiment, the recessed portions 130 include the first recessed portions 130A formed at the inclined surface 123, and therefore it is possible to improve the hydrophobicity of the inclined surface 123. Therefore, it is possible to excellently prevent the adhesion of liquid droplets LD scattering from the inner peripheral surface 120 to the substrate W.

Additionally, according to the present preferred embodiment, the recessed portions 130 include the second recessed portions 130B formed at the tubular surface 122. Liquid droplets LD received by the inclined surface 123 move downwardly along the inclined surface 123, and are guided to the tubular surface 122. In the present preferred embodiment, the recessed portions 130 include the second recessed portions 130B formed at the tubular surface 122, and therefore it is possible to improve the hydrophobicity of the tubular surface 122, and therefore it is possible to prevent a liquid from remaining on the tubular surface 122. Therefore, it is possible to prevent a collision between liquid droplets LD scattering from the substrate W toward the tubular surface 122 and liquid droplets LD remaining on the tubular surface 122. As a result, it is possible to excellently prevent the scattering of liquid droplets LD from the tubular surface 122 toward the substrate W, which is caused by a collision between liquid droplets LD newly scattering from the substrate W and liquid droplets LD remaining on the tubular surface 122.

Additionally, the size of the uneven portion 121 formed at the tubular surface 122 and the size of the uneven portion 121 formed at the inclined surface 123 may be equal to each other, or may differ from each other. For example, the width W2 of the first protruding portion 131A may be smaller than the width W2 of the second protruding portion 131B as shown in FIG. 5.

If so, the hydrophobicity of the inclined surface 123 is higher than the hydrophobicity of the tubular surface 122. It is possible to prevent liquid droplets LD from remaining on the inclined surface 123 by making the hydrophobicity of the inclined surface 123 higher than the hydrophobicity of the tubular surface 122. Liquid droplets LD scattering from the inclined surface 123 of the tubular guard 80 more easily adhere to the substrate W than liquid droplets LD scattering from the tubular surface 122. Therefore, it is possible to prevent liquid droplets LD from scattering from the inclined surface 123 and adhering to the substrate W by raising the hydrophobicity of the inclined surface 123.

<Water Droplet Scattering Angle Measurement Experiment>

A description will be given of results obtained by performing a water droplet scattering angle measurement experiment in which a liquid droplet LD (hereinafter, referred to as a "water droplet" when necessary) of DIW scattering from a substrate W is photographed with a high-speed camera and in which the scattering angle of a water droplet is measured.

Figure 12:
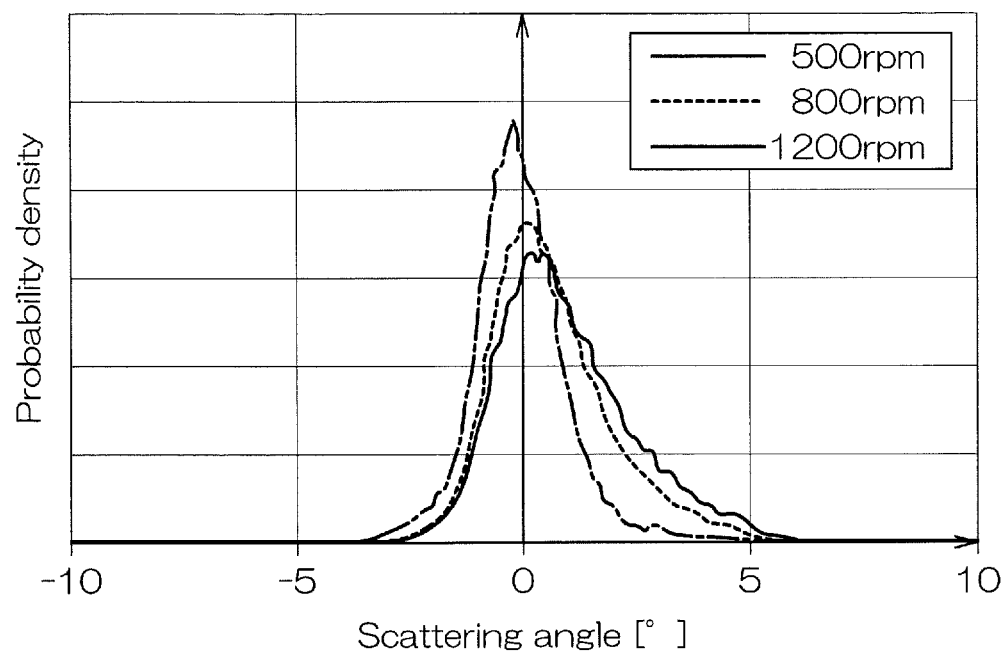
FIG. 12 is a graph showing a relationship between the rotation speed of a substrate and the scattering angle of a water droplet.

FIG. 12 is a graph showing a relationship between the rotation speed of the substrate W and the scattering angle θs of the water droplet. The abscissa axis of in the graph of FIG. 12 represents the scattering angle θs of the water droplet scattering from the substrate W. The scattering angle θs is larger than 0° if the scattering direction SD of the water droplet is an obliquely upward direction. The scattering angle θs is smaller than 0° if the scattering direction SD of the water droplet is an obliquely downward direction.

If the rotation speed of the substrate W is 500 rpm, the scattering angle θs of most liquid droplets LD is smaller than 0° as shown in FIG. 12, and therefore results were obtained showing that most liquid droplets LD scatter obliquely downwardly. If the rotation speed of the substrate W is 800 rpm or 1200 rpm, the scattering angle θs of most liquid droplets LD is larger than 0°, and therefore results were obtained showing that most liquid droplets LD scatter obliquely upwardly.

<Water Droplet Size Measurement Experiment>

A description will be given of results obtained by performing a water droplet size measurement experiment in which a water droplet scattering from a substrate W is photographed with a high-speed camera and in which the diameter of the water droplet is measured.

Figure 13:
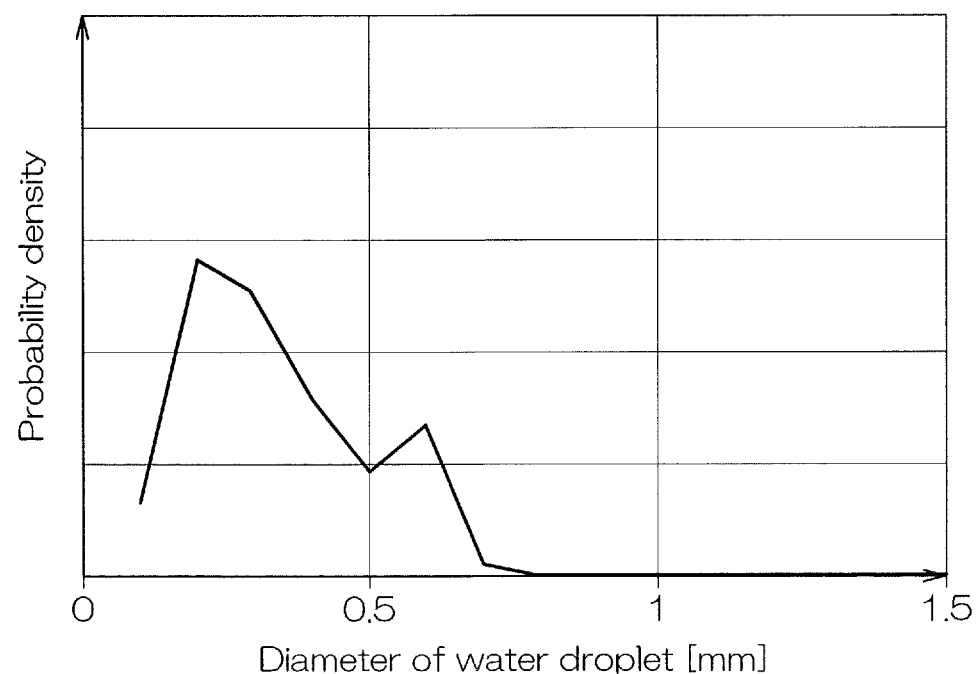
FIG. 13 is a graph showing the diameter of a water droplet scattering from a substrate.

FIG. 13 is a graph showing the diameter of a water droplet scattering from the substrate W when DIW is supplied at a rate of 0.5 L/min to the substrate W rotating at 1000 rpm. The abscissa axis in the graph of FIG. 13 represents the diameter Dm of a water droplet scattering from the substrate W, and the ordinate axis in the graph of FIG. 13 represents a probability at which a water droplet having each diameter will scatter therefrom. Results were obtained showing that each diameter Dm of most water droplets among water droplets scattering from the substrate W rotating at 1000 rpm is 1.5 mm or less as shown in FIG. 13. Results were obtained showing that the number of water droplets each of which has a diameter Dm of 1.0 mm or less is particularly high thereamong.

<Adhesion-Number-of-Water-Droplets Measurement Experiment>

A description will be given of results obtained by performing an adhesion-number-of-water-droplets measurement experiment in which the number of water droplets that have been splashed back from the tubular guard 80 and then have scattered toward the substrate W is observed with a microscope.

In detail, the number of water droplets that have been splashed back toward the substrate W for three seconds was measured by use of a high-speed camera while supplying DIW to the upper and lower surfaces of the substrate W at a rate of 2 L/min for three seconds while rotating the substrate W.

Figure 14:
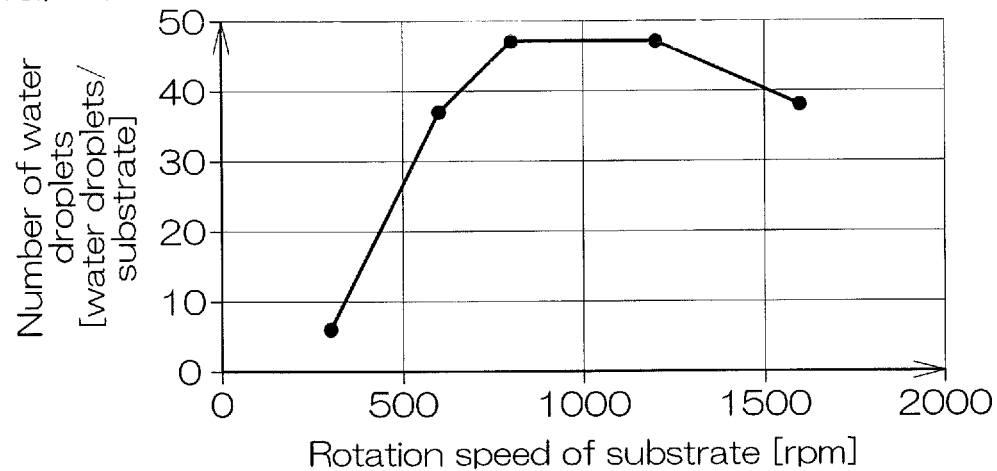
FIG. 14 is a graph showing a relationship between the number of water droplets scattering from a tubular guard and the rotation speed of a substrate.

FIG. 14 is a graph showing a relationship between the number of water droplets scattering from the tubular guard 80 and the rotation speed of the substrate W. In the graph of FIG. 14, the abscissa axis represents the rotation speed of the substrate W, and the ordinate axis represents the number of water droplets that scatter from the tubular guard 80 and then adhere to the upper surface of the substrate W. As shown in FIG. 14, results were obtained showing that the number of water droplets adhering to the upper surface of the substrate W is comparatively low when the rotation speed of the substrate W is set at 300 rpm, whereas the number of water droplets adhering to the upper surface of the substrate W is comparatively high when the rotation speed of the substrate W is set at 600 rpm. When the rotation speed of the substrate W is set at 800 rpm, 1200 rpm, and 1600 rpm, results were obtained showing that the number of water droplets adhering to the upper surface of the substrate W is higher in any case than when the rotation speed of the substrate W is set at 300 rpm in the same way as when the rotation speed of the substrate W is set at 600 rpm. Therefore, it is inferred that the scattering of liquid droplets from the tubular guard 80 to the upper surface of the substrate W becomes problematic when the rotation speed of the substrate W is set at 600 rpm or more.

Thereafter, DIW was supplied to the upper surface of the substrate W for 30 seconds at a rate of 2 L/min while rotating the substrate W at 1200 rpm, and the number of water droplets that have been splashed back from the tubular guard 80 and have adhered to the substrate W while supplying DIW was counted by use of water-sensitive paper.

Figure 15:
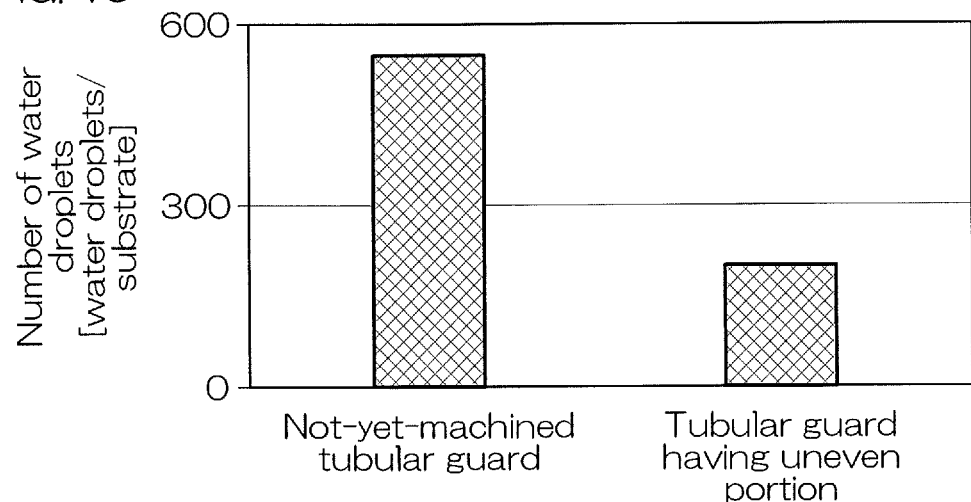
FIG. 15 is a graph shown to describe the effect, which is brought about by the presence of an uneven portion, of reducing the number of water droplets adhering to an upper surface of a substrate.

In order to ascertain the effect, which is brought about by the uneven portion 121, of reducing the amount of scattering water droplets, a comparison was made between the number of water droplets adhering to the upper surface of the substrate W when the tubular guard 80 having the uneven portion 121 is used and the number of water droplets adhering to the upper surface of the substrate W when the tubular guard 80 having no uneven portion 121 is used. FIG. 15 is a graph shown to describe the effect, which is brought about by the presence of the uneven portion 121, of reducing the number of water droplets adhering to the upper surface of the substrate W.

As shown in FIG. 15, results were obtained showing that the number of water droplets, which scatter from the tubular guard 80 ("tubular guard having the uneven portion" shown in FIG. 15) having the inner peripheral surface 120 at which the uneven portion 121 whose average surface roughness Ra is 3.0 or more is formed and which adhere to the upper surface of the substrate W is lower than the number of water droplets, which scatter from the tubular guard 80 ("unprocessed tubular guard" shown in FIG. 15) having the inner peripheral surface 120 at which the uneven portion 121 is not formed and which adhere to the upper surface of the substrate W. Hence, it is inferred that it is possible to reduce the number of water droplets scattering from the tubular guard 80 toward the substrate W because of the presence of the uneven portion 121 whose average surface roughness Ra is 3.0 or more.

<Adhesion-Number-of-Particles Measurement Experiment>

Figure 16:
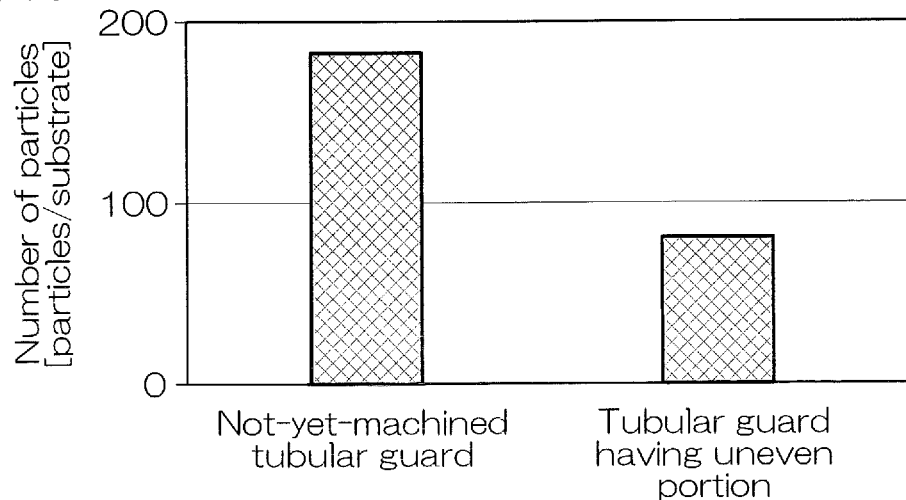
FIG. 16 is a graph shown to describe the effect, which is brought about by the presence of the uneven portion, of reducing the number of particles adhering to the upper surface of the substrate.

A description will be given of results obtained by performing an adhesion-number-of-particles measurement experiment in which the number of particles adhering to the upper surface of the substrate W after performing a substrate processing. In the adhesion-number-of-particles measurement experiment, substrate processing for processing the upper surface of the substrate W in order of diluted hydrofluoric acid, APM, and isopropyl alcohol (IPA) was performed, and then the number of particles adhering onto the substrate W was counted by use of a microscope. In order to ascertain the effect, which is brought about by the presence of the uneven portion 121, of reducing the number of particles adhering thereto, a comparison was made between the number of particles adhering to the upper surface of the substrate W when the tubular guard 80 having the uneven portion 121 is used and the number of particles adhering to the upper surface of the substrate W when the tubular guard 80 having no uneven portion 121 is used. FIG. 16 is a graph shown to describe the effect, which is brought about by the presence of the uneven portion 121, of reducing the number of particles adhering to the upper surface of the substrate W.

As shown in FIG. 16, results were obtained showing that the number of particles that adhere to the upper surface of the substrate W after performing a substrate processing by use of the tubular guard 80 ("tubular guard having the uneven portion" shown in FIG. 16) having the inner peripheral surface 120 at which the uneven portion 121 whose average surface roughness Ra is 3.0 or more is formed is lower than the number of particles that adhere to the upper surface of the substrate W after performing a substrate processing by use of the tubular guard 80 ("unprocessed tubular guard" shown in FIG. 16) having the inner peripheral surface 120 at which the uneven portion 121 is not formed. Hence, the number of water droplets scattering from the tubular guard 80 toward the substrate W is reduced because of the presence of the uneven portion 121 whose average surface roughness Ra is 3.0 or more, and, as a result, it is inferred that it is possible to reduce the number of particles adhering to the upper surface of the substrate W.

<Contact Angle Measurement Experiment>

Figure 17:
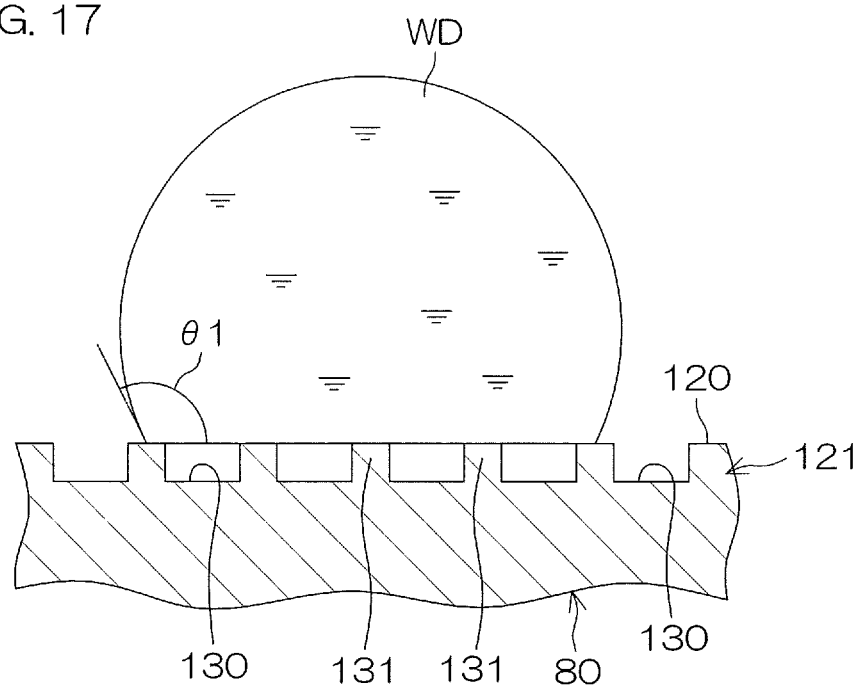
FIG. 17 is a view that schematically shows the vicinity of a water droplet dropped to the uneven portion in a contact angle measurement experiment.

Next, with reference to FIG. 17 and FIG. 18, a description will be given of results obtained by performing a contact angle measurement experiment in which a comparison is made between contact angles θ1 of a water droplet WD with respect to the tubular guards 80 having the uneven portions 121 having different average surface roughnesses Ra, respectively. FIG. 17 is a view that schematically shows the vicinity of a water droplet WD dropped to the uneven portion 121 in the contact angle measurement experiment.

The procedure of the contact angle measurement experiment is as follows. (1) A water droplet WD of 2 mm or more and 3 mm or less is dropped to the inner peripheral surface 120. (2) An image of the vicinity of the water droplet WD is obtained by use of a microscope. (3) A contact angle θ1 of the water droplet WD with respect to the inner peripheral surface 120 is measured on the basis of the image obtained in (2).

In the contact angle measurement experiment, the tubular guard 80 having the inner peripheral surface 120 at which the uneven portion 121 is not formed and four kinds of tubular guards 80 having inner peripheral surfaces 120 at which uneven portions 121 having mutually-different average surface roughnesses Ra, respectively, are formed were each used as a sample.

The average surface roughness Ra, the width W1 and the depth De of the recessed portion 130, and the width W2 of the protruding portion 131 of each sample are as in Table 1. As shown in Table 1, the tubular guard 80 (sample A) having the inner peripheral surface 120 at which the uneven portion 121 is not formed is recorded as "Unprocessed" in the column of average surface roughness Ra. Additionally, with respect to sample A, each size (width W1 and depth De of the recessed portion 130, width W2 of the protruding portion 131) is not measured, and hence is recorded as "–" in the column of each size.

TABLE 1

| Sample | Average surface roughness Ra | Width W1 of recessed portion | Depth De of recessed portion | Width W2 of protruding portion |
|---|---|---|---|---|
| Sample A | Unprocessed | — | — | — |
| Sample B | 1.3 | 30 to 80 μm | 5 to 15 μm | 10 to 60 μm |
| Sample C | 3.1 | 220 to 255 μm | 20 to 40 μm | 6 to 15 μm |
| Sample D | 4.5 | 350 to 380 μm | 50 to 70 μm | 8 to 20 μm |
| Sample E | 6.5 | 450 μm or more | 90 μm or more | 6 to 40 μm |

Each size shown in Table 1 was measured by use of a microscope. The number of samples was set at five, i.e., samples A to E (N=5). Each sample was formed by injection molding in which PFA is used as a material.

Figure 18:
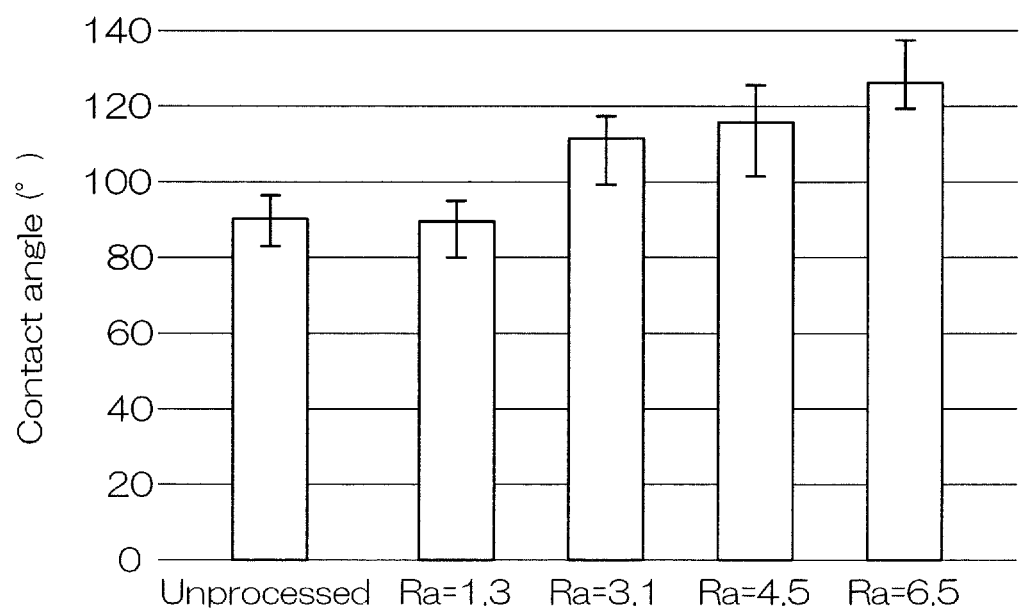
FIG. 18 is a graph showing results obtained by a contact angle measurement experiment performed by use of a tubular guard having uneven portions that differ from each other in average surface roughness.

FIG. 18 is a graph showing results obtained by the contact angle measurement experiment. The contact angle θ1 of a water droplet WD with respect to sample A was 83° or more and 96° or less as shown in FIG. 18. The contact angle θ1 of a water droplet WD with respect to sample B was 80° or more and 95° or less. Therefore, it is inferred that the inner peripheral surface 120 cannot be sufficiently hydrophobized if the average surface roughness Ra is about 1.3.

The contact angle θ1 of a water droplet WD with respect to sample C was 99° or more and 116° or less. The contact angle θ1 of a water droplet WD with respect to sample D was 102° or more and 126° or less. Additionally, the contact angle θ1 of a water droplet WD with respect to sample E was 119° or more and 137° or less. Therefore, it is inferred that the inner peripheral surface 120 can be sufficiently hydrophobized if the average surface roughness Ra is at least 3.0 or more.

It is inferred that the following contents can be achieved on the basis of the results of the adhesion-number-of-water-droplets measurement experiment shown in FIGS. 14 and 15, the results of the adhesion-number-of-particles measurement experiment shown in FIG. 16, and the results of the contact angle measurement experiment shown in FIG. 18.

The inner peripheral surface 120 can be sufficiently hydrophobized if the average surface roughness Ra is 3.0 or more. Additionally, even if the average surface roughness is 3.0 or more and even if the rotational speed of the substrate W is 600 rpm or more, liquid droplets LD can be prevented from being splashed back from the tubular guard 80, and particles can be prevented from adhering to the upper surface of the substrate W.

<Machining Method of Tubular Guard>

Figure 19A:
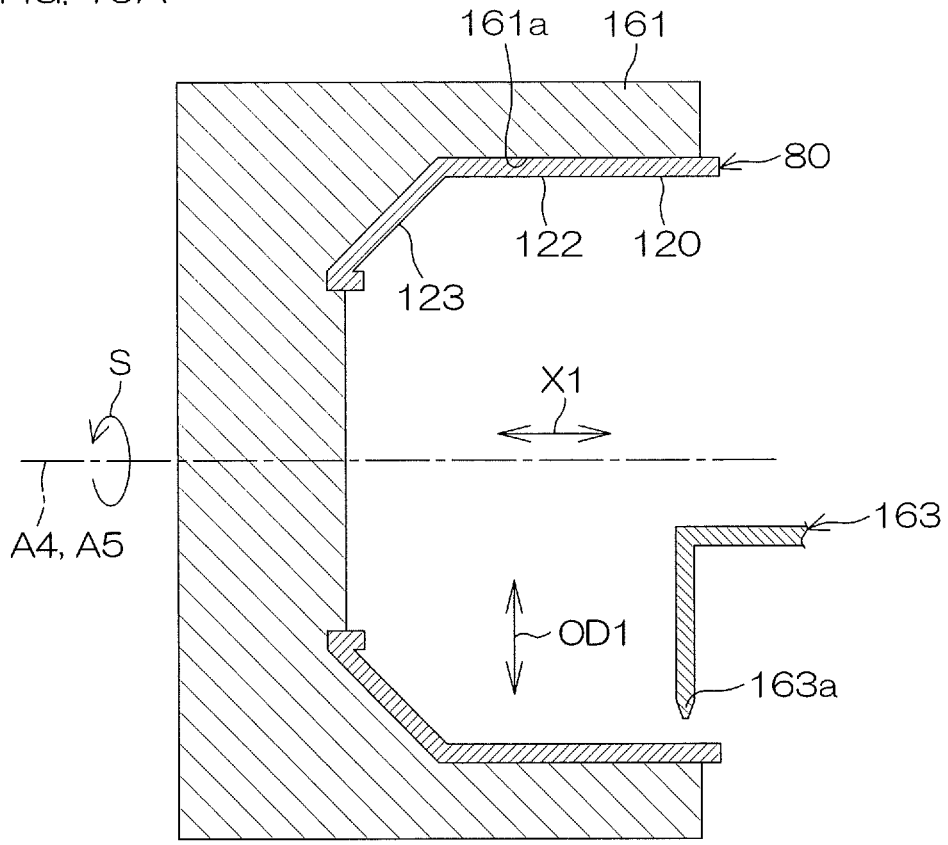
FIG. 19A to FIG. 19D are schematic views shown to describe a method of producing the tubular guard.

A method of machining the tubular guard 80 will be hereinafter described in detail. FIG. 19A to FIG. 19D are schematic views each of which is shown to describe the machining method of the tubular guard 80. The machining method shown in FIGS. 19A to 19D is a lathe rotation machining method. First, a not-yet-machined tubular guard 80 that is a to-be machined component is prepared as shown in FIG. 19A (guard preparation step). In detail, preparations for the tubular guard 80 are completed by allowing a holding member 161 to hold the tubular guard 80 so that the central axis A4 of the tubular guard 80 coincides with a rotational axis A5 of the holding member 161 (guard holding step). The not-yet-machined tubular guard 80 denotes the tubular guard 80 in which the uneven portion 121 is not formed at the inner peripheral surface 120.

The holding member 161 is rotated around the predetermined rotational axis A5 in a state in which the holding member 161 is holding the tubular guard 80 (guard rotation step). The holding member 161 has a tubular hole 161a that surrounds the tubular guard 80 from the outside. The not-yet-machined tubular guard 80 has the same configuration as the tubular guard 80, except for the fact that the uneven portion 121 is not formed at the inner peripheral surface 120.

Thereafter, the inner peripheral surface 120 of the tubular guard 80 is cut and machined by use of a cutting member 163 while rotating the tubular guard 80 around the rotational axis A5 (central axis A4). The cutting member 163 is a member whose front end has a needle-shaped edge 163a. In detail, the uneven portion 121 (see FIG. 19C) is formed at the inner peripheral surface 120 while moving the cutting member 163 in the axial direction X1 along the rotational axis A5 (uneven portion formation step).

Figure 19B:
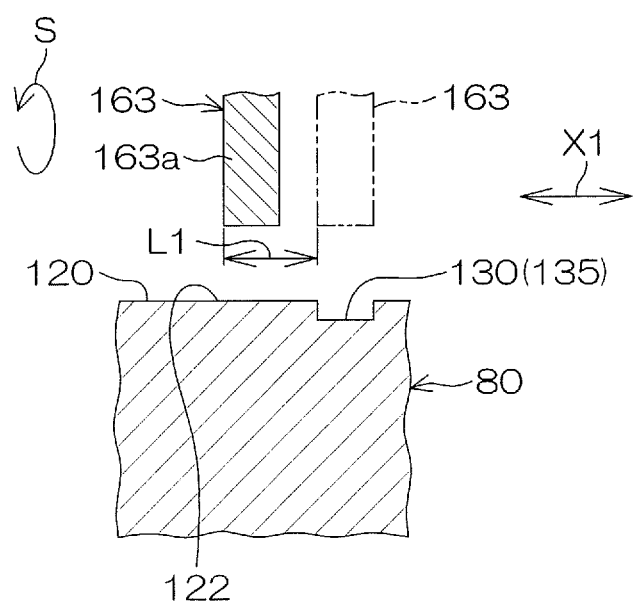

Next, the uneven portion formation step will be described in detail. As shown in FIG. 19B, the cutting member 163 is moved by a predetermined sending distance L1 per predetermined sending period of time in a direction that intersects the rotation direction S of the tubular guard 80 and that is along the inner peripheral surface 120 of the tubular guard 80 (cutting member moving step).

Figure 19C:
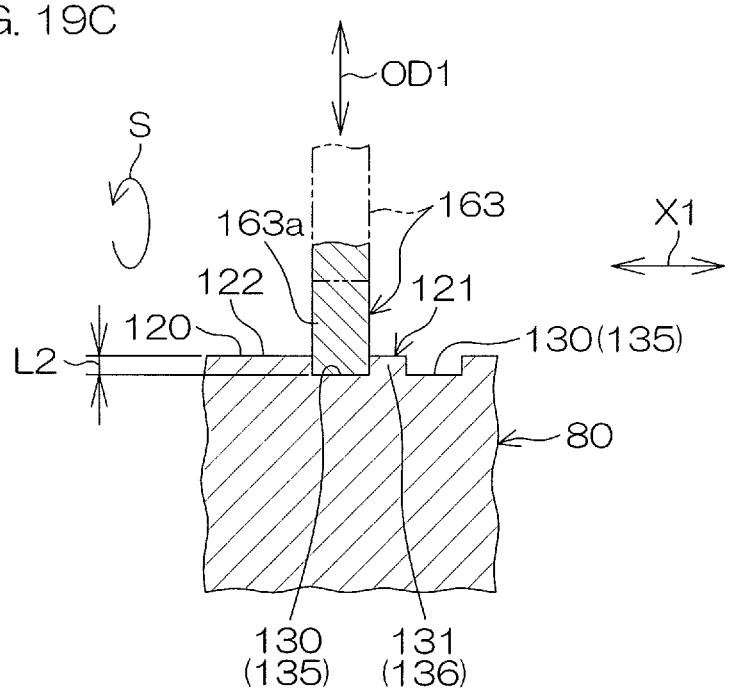

The cutting member 163 is moved by the sending distance L1, and then the cutting member 163 is moved in an orthogonal direction OD1 that is perpendicular to the inner peripheral surface 120 as shown in FIG. 19C. In detail, the cutting member 163 is moved to a push position at which the edge 163a is pushed to the inner peripheral surface 120 by a predetermined push amount L2. Hence, the inner peripheral surface 120 is cut, and the recessed portion 130, which is a constituent of the uneven portion 121, is formed at the inner peripheral surface 120 (cutting step).

The recessed portion 130 extending over the whole area in the circumferential direction of the inner peripheral surface 120 is formed, i.e., the circular groove portion 135 is formed by maintaining the cutting member 163 for a predetermined period of time in a state in which the cutting member 163 has been pushed to the inner peripheral surface 120. After the predetermined period of time elapses, the cutting member 163 is moved in the orthogonal direction OD1 perpendicular to the inner peripheral surface 120 so that the cutting member 163 recedes from the inner peripheral surface 120. Thereafter, again, the cutting member moving step and the cutting step are repeatedly performed. The protruding portion 131 (circular protruding portion 136) is formed between the mutually adjacent recessed portions 130 by forming the recessed portions 130. The inner peripheral surface 120 is hydrophobized by forming the uneven portion 121 at the inner peripheral surface 120 (hydrophobizing step).

As thus described, it is possible to form the circular groove portions 135 each of which has a certain depth with certain intervals between the circular groove portions 135 by simply moving the cutting member 163. Therefore, it is possible to improve uniformity in size of the uneven portion 121 formed at the inner peripheral surface 120.

Figure 19D:
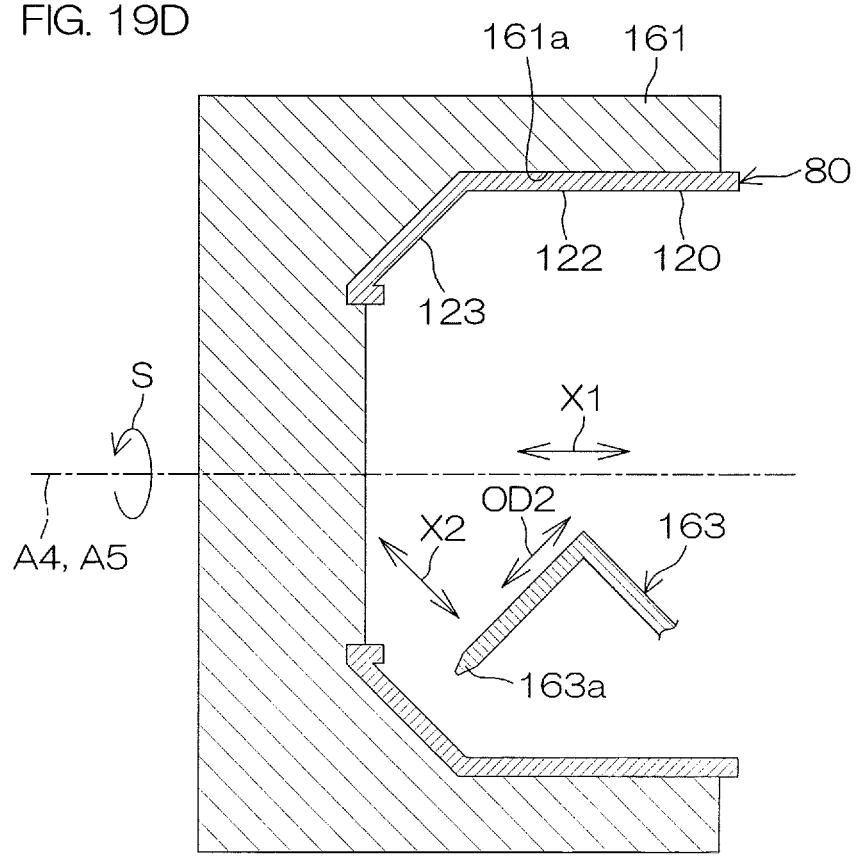

The inner peripheral surface 120 has the tubular surface 122 and the inclined surface 123. Therefore, in the cutting member moving step, the cutting member 163 is moved in the direction (axial direction X1) along the tubular surface 122 (first moving step) as shown in FIGS. 19A and 19B when the uneven portion 121 is formed at the tubular surface 122. In the cutting step, the cutting member 163 is pushed from the orthogonal direction OD1 perpendicular to the tubular surface 122 to the tubular surface 122 as shown in FIGS. 19A and 19C (first pushing step). In the cutting member moving step, the cutting member 163 is moved in the direction (the inclined direction X2 with respect to the axial direction X1) along the inclined surface 123 (second moving step) as shown in FIG. 19D when the uneven portion 121 is formed at the inclined surface 123. In the cutting step, the cutting member 163 is pushed from the orthogonal direction OD2 perpendicular to the inclined surface 123 to the inclined surface 123 (second pushing step).

When the uneven portion 121 is formed at the inclined surface 123, the angle of the cutting member 163 is adjusted so that the cutting member 163 can be moved along the inclined surface 123 and so that the cutting member 163 can be pushed from the orthogonal direction OD2 perpendicular to the inclined surface 123 to the inclined surface 123. In other words, the angle of the cutting member 163 is adjusted in accordance with the angle of a to-be-machined surface.

As thus described, it is possible to form groove portions each of which has a certain depth with certain intervals between the groove portions by simply moving the cutting member along the tubular surface 122 and the inclined surface 123. Therefore, it is possible to improve uniformity of the groove portions of the uneven portion formed at the inner peripheral surface.

As thus described, if the recessed portion 130 is the circular groove portion 135, it is possible to form the uneven portion 121 merely by allowing the cutting member 163 to simply work while rotating the tubular guard 80. Therefore, machining can be more easily performed than in a case in which discontinuous recessed portions 130 are formed along the circumferential direction CD of the inner peripheral surface 120.

<Modification of Uneven Portion>

FIG. 20A to FIG. 20E are schematic views shown to describe first to fifth modifications, respectively, of the uneven portion 121. FIG. 20A to FIG. 20E are views of the uneven portion 121 seen from an orthogonal direction perpendicular to the inclined surface 123.

Figure 20A:
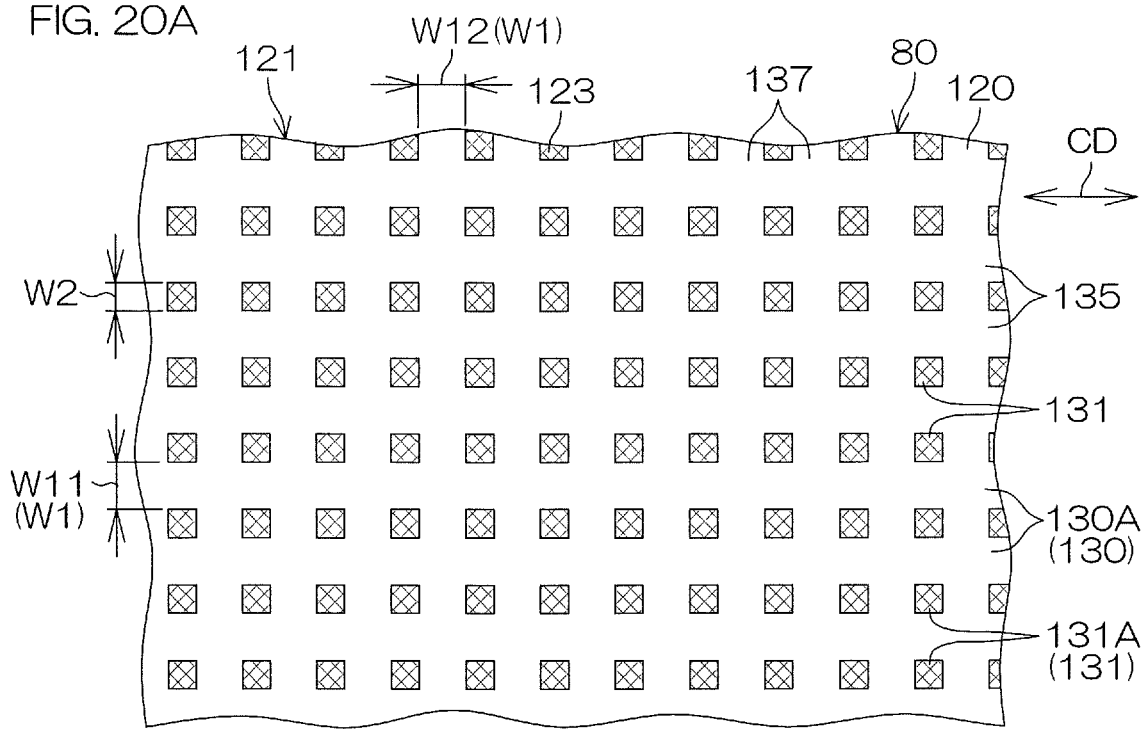
FIG. 20A is a schematic view shown to describe a first modification of the uneven portion.

As in the first modification shown in FIG. 20A, the recessed portions 130 of the uneven portion 121 may include, in addition to the circular groove portions 135, a plurality of intersection groove portions 137 extending in a direction that intersects with the circular groove portion 135. In FIG. 20A, the intersection groove portion 137 extends in a direction perpendicular to the circular groove portion 135. A lattice shape is formed by the circular groove portions 135 and the intersection groove portions 137. Each of the protruding portions 131 has its four sides surrounded by a pair of circular groove portions 135 and a pair of intersection groove portions 137. The width W2 of the protruding portion 131 is smaller than the width W11 (width W1) of the circular groove portion 135 and than the width W12 (width W1) of the intersection groove portion 137. The width W11 and the width W12 may differ from each other.

In the first modification, the lattice shape is formed by the intersection groove portions 137 and the circular groove portions 135, and therefore hydrophobicity can be evenly made in the whole area of the uneven portion 121 higher than in a configuration in which only the circular groove portion 135 is provided as the recessed portion 130.

Figure 20B:
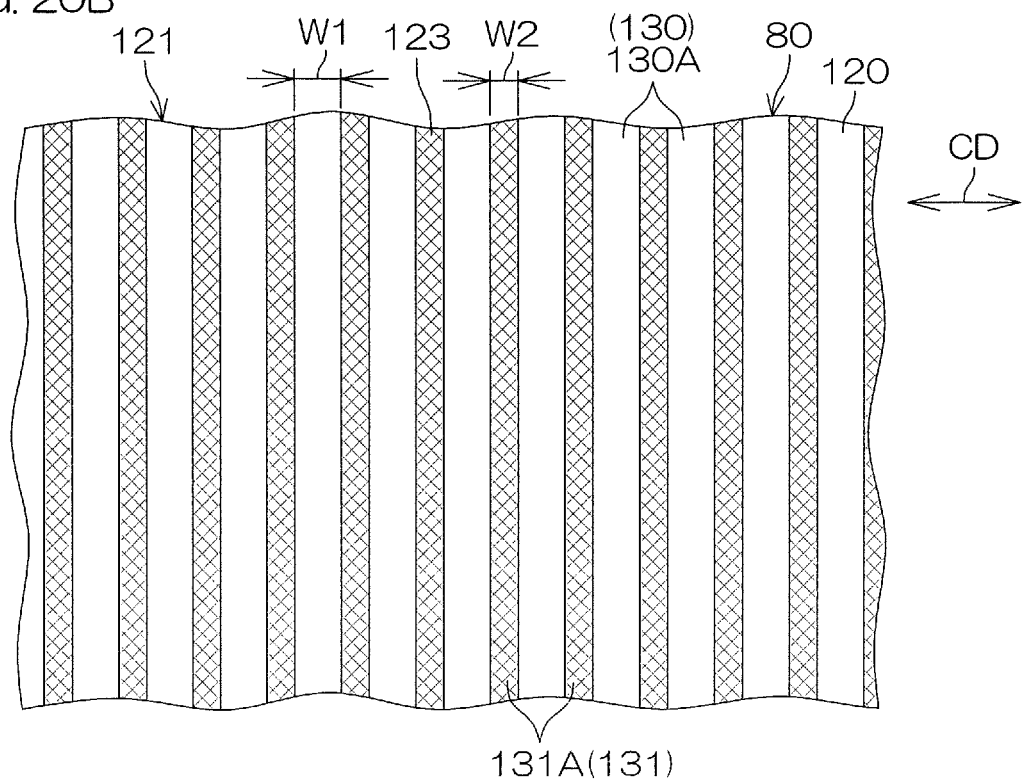
FIG. 20B is a schematic view shown to describe a second modification of the uneven portion.

The recessed portion 130 may be a longitudinal groove extending upwardly and downwardly as shown in FIG. 20B. In this case, the protruding portions 131 extend upwardly and downwardly. The recessed portions 130 (a plurality of longitudinal grooves) are arranged side by side along the circumferential direction CD, and the protruding portion 131 is placed between the longitudinal grooves adjacent to each other in the circumferential direction CD.

Additionally, the recessed portion 130 may be an inclined groove that extends obliquely with respect to the circumferential direction CD (horizontal direction) as shown in FIGS. 20C and 20D.

Additionally, the recessed portion 130 may be a circular hole as shown in FIG. 20E. If the recessed portions 130 are circular holes, the circular holes are equally spaced out in the circumferential direction CD and in the orthogonal direction perpendicular to the circumferential direction CD. The protruding portion 131 is a portion between the circular holes adjacent to each other. The width W1 of the recessed portion 130 corresponds to the diameter of the circular hole, and the width W2 of the protruding portion 131 corresponds to an interval between the circular holes adjacent to each other in the up-down direction or in the horizontal direction.

The recessed portions 130 and the protruding portions 131 both of which compose the uneven portion 121 are not necessarily required to be regularly arranged as in the preferred embodiment and the first to fifth modifications described above, and may be irregularly arranged.

In the aforementioned modifications, the uneven portion 121 formed at the inclined surface 123 has been described as an example, and yet a similar modification is applicable also to the uneven portion 121 formed at the tubular surface 122.

Other Preferred Embodiments

The present invention is not limited to the preferred embodiment described above, and can be embodied in yet other modes.

For example, two tubular guards 80 (first and second tubular guards 80A and 80B) are provided in the aforementioned preferred embodiment. However, unlike the aforementioned preferred embodiment, only either one of the tubular guards 80 may be provided.

Additionally, in the aforementioned preferred embodiment, the chemical liquid nozzle 31, the upper rinse liquid nozzle 32, and the lower rinse liquid nozzle 33 are illustrated as the processing liquid nozzle 30. However, in addition to the chemical liquid nozzle 31, the upper rinse liquid nozzle 32, and the lower rinse liquid nozzle 33, an organic solvent nozzle that discharges an organic solvent, such as IPA, toward the upper surface of the substrate W may be provided as the processing liquid nozzle 30. Additionally, the chemical liquid nozzle 31 may be arranged to selectively discharge a plurality of chemical liquids. In this case, substrate processing performed in the adhesion-number-of-particles measurement experiment can be performed, i.e., substrate processing in which the upper surface of the substrate W is treated in order of hydrofluoric acid, APM, and IPA can be performed.

Additionally, the partition plate 104 is provided in the aforementioned preferred embodiment. However, unlike the aforementioned preferred embodiment, a configuration may be employed in which the partition plate 104 is not disposed and in which the outside-guard space 103 is not divided into upper and lower spaces. In this case, the exhaust connection pipe 45 is opened in the sidewall 17B of the processing chamber 17.

Additionally, the not-yet-machined tubular guard 80 is used in the machining method of the tubular guard 80 shown in FIGS. 19A to 19D. However, the machining method shown in FIGS. 19A to 19D can be used when additional machining of the uneven portion 121 (additionally forming the uneven portion 121) is applied to the tubular guard 80 having the inner peripheral surface 120 at which the uneven portion 121 has already been formed.

Additionally, the machining method of the tubular guard 80 is not limited to the aforementioned lathe rotation cutting, and may be laser beam machining in which the recessed portion 130 is formed at the inner peripheral surface 120 of the tubular guard 80 by means of laser radiation. Additionally, the machining method may be mold transfer machining in which the recessed portion 130 is formed at the inner peripheral surface 120 by transferring the uneven portion formed in a mold to the inner peripheral surface 120.

Additionally, the dimensions of the uneven portion 121 are not necessarily required to be fixed in the inclined surface 123, and a plurality of areas in which the dimensions of the uneven portion 121 (width W1 and depth De of the recessed portion 130, width W2 of the protruding portion 131) differ from each other, i.e., average surface roughnesses Ra of the uneven portion 121 differ from each other may exist in the inclined surface 123. Likewise, a plurality of areas in which average surface roughnesses Ra differ from each other may exist in the tubular surface 122.

Additionally, in the aforementioned preferred embodiment, the processing units 5 are included in the substrate processing apparatus 1 together with the substrate placing portions 6, the indexer robot IR, the main transfer robots CR, and the controller 4. However, the substrate processing apparatus may consist of only the single processing unit 5. In other words, the processing unit 5 may be an example of the substrate processing apparatus.

In the aforementioned preferred embodiment, expressions "along," "horizontal," and "vertical" are used, and yet these expressions are not required to be strictly "along," strictly "horizontal," and strictly "vertical." In other words, these expressions are each to allow errors or deviations in manufacturing accuracy, in installing accuracy, etc.

In this description, when a numerical value range is represented by use of "to" or "–," these representations include both endpoints, and the unit is common unless a strictly limited mention is made.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

What is claimed is:

1. A substrate processing apparatus comprising:
   a spin chuck that rotates a substrate around a predetermined rotational axis while holding the substrate;
   a liquid supply nozzle that supplies a liquid to the substrate held by the spin chuck; and
   a resin-made tubular guard that surrounds the substrate held by the spin chuck,
   wherein the tubular guard has an inner peripheral surface and an uneven portion disposed at the inner peripheral surface,
   the uneven portion has a plurality of recessed portions and a plurality of protruding portions placed between the recessed portions adjacent to each other,
   each of the recessed portions has a width smaller than a diameter of a liquid droplet scattering from the substrate held by the spin chuck and a depth in which the liquid droplet does not come into contact with a bottom portion of each of the recessed portions in a state in which the liquid droplet is in contact with the protruding portions,
   each of the protruding portions has a width that is smaller than the diameter of the liquid droplet and that is smaller than the width of the recessed portions,
   wherein average surface roughness of the uneven portion is 3.0 or more and 6.0 or less.

2. The substrate processing apparatus according to claim 1, wherein the diameter of the liquid droplet is the diameter of the liquid droplet scattering from the substrate that is rotated by the spin chuck at a rotation speed of 600 rpm or more and 1200 rpm or less.

3. The substrate processing apparatus according to claim 1, wherein the diameter of the liquid droplet is 1.5 mm or less.

4. The substrate processing apparatus according to claim 1, wherein the recessed portions include a plurality of circular groove portions along a circumferential direction of the inner peripheral surface, and the circular groove portions are disposed at the inner peripheral surface with intervals between the circular groove portions in an axial direction along a central axis of the inner peripheral surface.

5. The substrate processing apparatus according to claim 4, wherein the recessed portions include a plurality of intersection groove portions extending in a direction intersecting the circular groove portions, and a lattice shape is formed by the intersection groove portions and the circular groove portions.

6. The substrate processing apparatus according to claim 1, wherein the inner peripheral surface of the tubular guard has a tubular surface extending in a vertical direction and an inclined surface that is connected to an upper end of the tubular surface and that extends obliquely with respect to the tubular surface, and the recessed portions include a plurality of first recessed portions formed at the inclined surface.

7. The substrate processing apparatus according to claim 6, wherein the recessed portions include a plurality of second recessed portions formed at the tubular surface.

8. The substrate processing apparatus according to claim 7, wherein the protruding portions include a plurality of first protruding portions placed between the first recessed portions adjacent to each other and a second protruding portion placed between the second recessed portions adjacent to each other, and a width of the first protruding portions is smaller than a width of the second protruding portion.

9. The substrate processing apparatus according to claim 1, wherein the tubular guard is made of hydrophobic resin.

* * * * *